United States Patent
Tsujii

(10) Patent No.: US 7,517,745 B2
(45) Date of Patent: Apr. 14, 2009

(54) SEMICONDUCTOR DEVICE HAVING MOSFET WITH OFFSET-SPACER, AND MANUFACTURING METHOD THEREOF

(75) Inventor: Hideji Tsujii, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 497 days.

(21) Appl. No.: 11/377,860

(22) Filed: Mar. 17, 2006

(65) Prior Publication Data

US 2006/0160285 A1    Jul. 20, 2006

Related U.S. Application Data

(62) Division of application No. 10/885,756, filed on Jul. 8, 2004, now Pat. No. 7,042,050.

(30) Foreign Application Priority Data

Mar. 19, 2004  (JP)  ............... 2004-080810

(51) Int. Cl.
*H01L 21/338* (2006.01)
(52) U.S. Cl. .............. 438/184; 438/286; 438/303
(58) Field of Classification Search ........ 438/286, 438/303, 305–307, 366, 445, 595, 184; 257/344, 257/900

See application file for complete search history.

(56) References Cited

U.S. PATENT DOCUMENTS

| | | | |
|---|---|---|---|
| 5,831,306 A | 11/1998 | Gardner et al. | |
| 5,841,168 A | 11/1998 | Gardner et al. | |
| 5,900,666 A | 5/1999 | Gardner et al. | |
| 5,973,362 A * | 10/1999 | Park et al. | 257/344 |
| 6,078,080 A | 6/2000 | Kadosh et al. | |
| 6,391,725 B1 | 5/2002 | Park et al. | |

FOREIGN PATENT DOCUMENTS

| | | |
|---|---|---|
| JP | 2-40924 | 2/1990 |
| JP | 3-273646 | 12/1991 |
| JP | 5-3206 | 1/1993 |
| JP | 11-274492 | 10/1999 |
| JP | 2001-237409 | 8/2001 |

OTHER PUBLICATIONS

A. Hokazono, et al., Electron Devices Meeting, 2002, IEDM '02, Digest International, pp. 639-642, "14NM Gate Length CMOSFETS Utilizing Low Thermal Budget Process with Poly-SiGe and Ni Salicide", Dec. 8 and 11, 2002.

* cited by examiner

*Primary Examiner*—Thinh T Nguyen
(74) *Attorney, Agent, or Firm*—Oblon, Spivak, McClelland, Maier & Neustadt, P.C.

(57) ABSTRACT

A semiconductor device includes a gate insulating film which is formed on the major surface of a semiconductor substrate, a gate electrode which is formed on the gate insulating film, a first offset-spacer which is formed in contact with one side surface of the gate electrode, a first spacer which is formed in contact with the other side surface of the gate electrode, a second spacer which is formed in contact with the first offset-spacer, and source and drain regions which are formed apart from each other in the major surface of the semiconductor substrate below the first and second spacers so as to sandwich the gate electrode and the first offset-spacer. The source region is formed at a position deeper than the drain region. The dopant concentration of the source region is higher than that of the drain region.

6 Claims, 18 Drawing Sheets

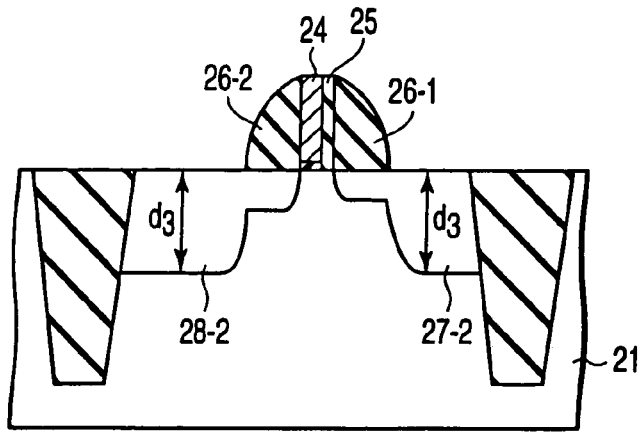
F I G. 10
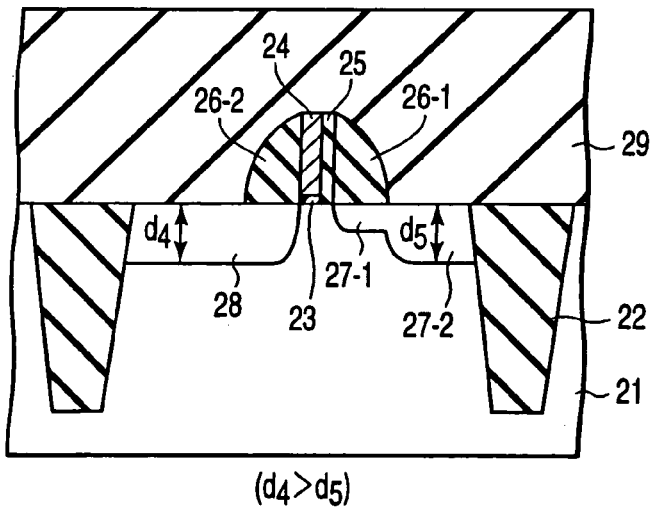
($d_4 > d_5$)
F I G. 11
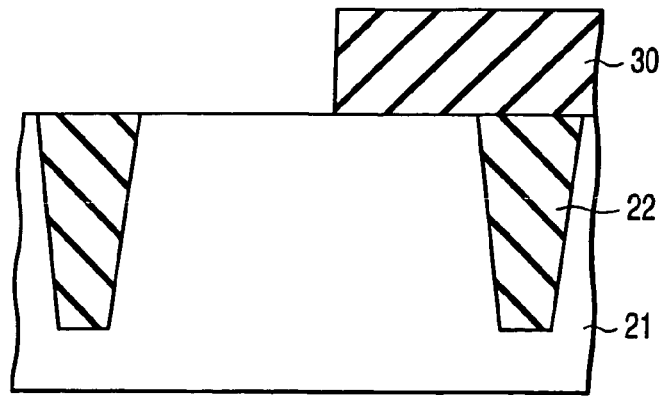
F I G. 12

($d_4 > d_5$)

($d_4 > d_5$)

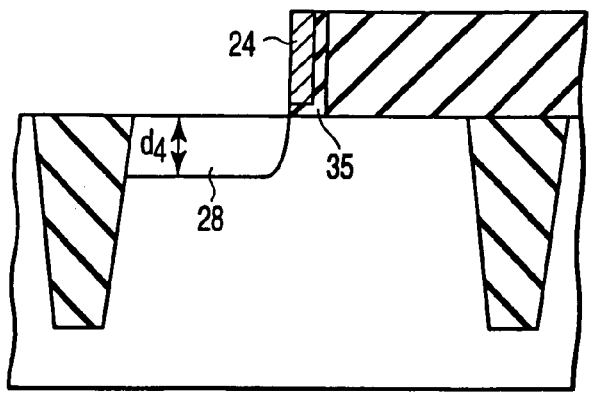
F I G. 2 2
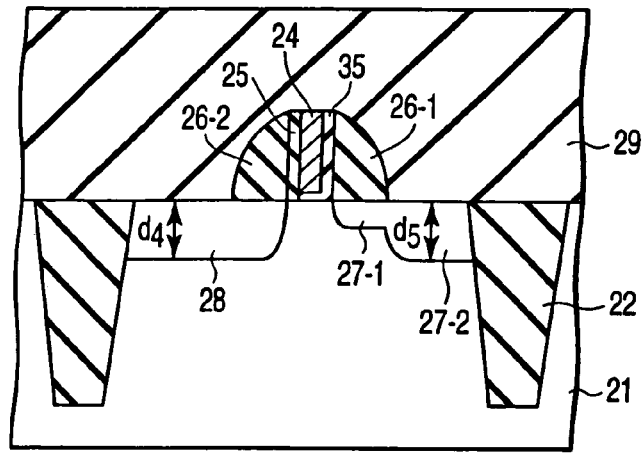
($d_4 > d_5$)
F I G. 2 3
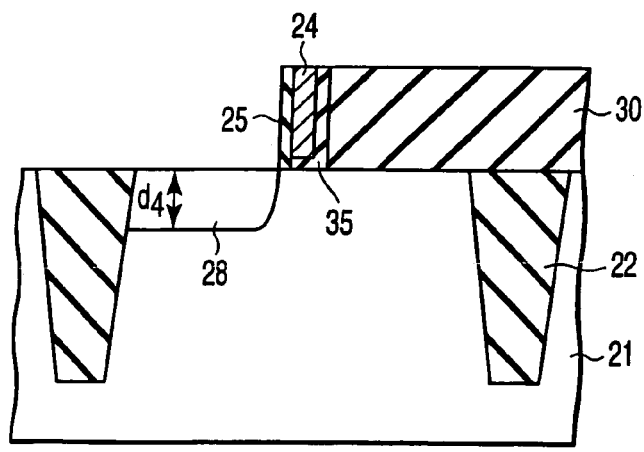
F I G. 2 4

($d_4 > d_5$)

($d_3 > d_1 > d_2$)

($d_3 > d_1 > d_2$)

$(d_3 > d_1 > d_2)$ $(d_3 > d_1 > d_2)$

SEMICONDUCTOR DEVICE HAVING MOSFET WITH OFFSET-SPACER, AND MANUFACTURING METHOD THEREOF

CROSS-REFERENCE TO RELATED APPLICATIONS

This application is based upon and claims the benefit of priority from prior Japanese Patent Application No. 2004-080810, filed Mar. 19, 2004, the entire contents of which are incorporated herein by reference.

BACKGROUND OF THE INVENTION

1. Field of the Invention

The present invention relates to a semiconductor device and manufacturing method thereof, and is applied to, e.g., a MOSFET (Metal Oxide Semiconductor Field Effect Transistor) having an offset-spacer.

2. Description of the Related Art

There has conventionally been proposed a semiconductor device utilizing a so-called offset structure. This device improves the drain breakdown voltage or the like by setting the interval between the gate and the drain larger than that between the gate and the source (see, e.g., Hokazono, A. et al., "14 nm gate length CMOSFETs utilizing low thermal budget process with poly-SiGe and Ni salicide", Electron Devices Meeting, 2002. IEDM '02. Digest. International, 8-11 Dec. 2002, P. 639-642).

A conventional semiconductor device and manufacturing method thereof will be explained in detail with reference to FIGS. 1 to 3. FIG. 1 is a sectional view showing the conventional semiconductor device. As shown in FIG. 1, in the conventional semiconductor device, offset-spacers 11 are formed from the same material, e.g., a silicon oxide film with the same shape on the right and left side walls of a gate electrode 12. Left and right dopant diffusion regions serving as a source 13 and drain 14 also have the same shape, dopant concentration, and depth. The offset-spacers 11 are arranged on the right and left of the gate electrode 12, and formed from a material such as a silicon oxide film with a thickness of, e.g., about 4 nm. The offset-spacers 11 separate the gate electrode 12 from doping of a dopant into a shallow dopant diffusion region (extension region). In operation, the offset-spacers 11 suppress the spread of the depletion layer, relaxing the short-channel effect.

However, this structure sometimes fails to satisfactorily relax the short-channel effect along with a recent shrinkage in cell size. In the conventional structure, the offset-spacer 11 on the drain 14 which receives a high electric-field is not thick enough. The source 13 and drain 14 have the same dopant concentration and depth. As a result, the spread of the depletion layer cannot be fully suppressed, and the short-channel effect cannot be sufficiently relaxed. This leads to a small operation margin and poor reliability.

A conventional semiconductor device manufacturing method will be described with reference to FIGS. 2 and 3. An offset-spacer material 15 is isotropically deposited and grown on the entire surface.

As shown in FIG. 3, the offset-spacer material 15 is etched back and left on the side walls of a gate electrode 12 to form offset-spacers 11.

For this reason, the film thicknesses of the right and left offset-spacers 11 on the gate electrode 12 cannot be changed. The offset-spacers 11 can only be formed from the same material.

Shallow dopant diffusion regions (extension regions) 16 serving as a source 13 and drain 14 are formed by ion implantation. The ion implantation step of forming the shallow dopant diffusion regions (extension regions) 16 cannot form dopant diffusion regions having different profiles on the right and left of the gate electrode 12.

As described above, the conventional semiconductor device manufacturing method suffers low selectivity: the film thickness and material of the offset-spacer cannot be easily selected and the depth and concentration of the dopant diffusion region cannot be easily selected. As a result, optimal values cannot be selected for the offset-spacer and dopant diffusion region, degrading the reliability.

BRIEF SUMMARY OF THE INVENTION

According to an aspect of the present invention, there is provided a semiconductor device comprising a gate insulating film which is formed on a major surface of a semiconductor substrate, a gate electrode which is formed on the gate insulating film, a first offset-spacer which is formed in contact with one side surface of the gate electrode, a first spacer which is formed in contact with the other side surface of the gate electrode, a second spacer which is formed in contact with the first offset-spacer, a first source region and a first drain region which are formed apart from each other in the major surface of the semiconductor substrate below the first and second-spacers so as to sandwich the gate electrode and the first offset-spacer, the first source region being formed at a position deeper than the first drain region and a dopant concentration of the first source region being higher than a dopant concentration of the first drain region, a second source region which is formed adjacent to the first source region, the second source region being formed at a position deeper than the first source region and a dopant concentration of the second source region being higher than the dopant concentration of the first source region, and a second drain region which is formed adjacent to the first drain region, the second drain region being formed at a position deeper than the first drain region and a dopant concentration of the second drain region being higher than the dopant concentration of the first drain region.

According to another aspect of the present invention, there is provided a semiconductor device comprising a gate insulating film which is formed on a major surface of a semiconductor substrate, a gate electrode which is formed on the gate insulating film, a first offset-spacer which is formed in contact with one side surface of the gate electrode, a first spacer which is formed in contact with the other side surface of the gate electrode, a second spacer which is formed in contact with the first offset-spacer, and a source region and a drain region which are formed apart from each other in the major surface of the semiconductor substrate below the first and second spacers so as to sandwich the gate electrode and the first offset-spacer, the source region being formed at a position deeper than the drain region and a dopant concentration of the source region being higher than a dopant concentration of the drain region.

According to another aspect of the invention, there is provided a method of manufacturing a semiconductor device, comprising forming element isolation films in a major surface of a semiconductor substrate to form an element region, forming a dummy pattern layer on the semiconductor substrate in a prospective drain region, forming an offset-spacer material in the element region and on the dummy pattern layer, etching back the offset-spacer material to form a first offset-spacer in contact with a side wall of the dummy pattern layer, forming a gate insulating film material in the element region and on the first offset-spacer and the dummy pattern layer, forming a gate electrode material on the gate insulating film material, anisotropically etching the gate insulating film material and the gate electrode material, forming a gate insulating film and a gate electrode on the semiconductor substrate, doping a dopant of a conductivity type opposite to a conductivity type of the semiconductor substrate by using the dummy pattern layer as a mask, thereby forming a first source region in the semiconductor substrate, removing the dummy pattern layer, doping a dopant of the conductivity type opposite to the conductivity type of the semiconductor substrate into the semiconductor substrate to form a first drain region at a position shallower than the first source region in the semiconductor substrate, forming a first spacer on a side wall of the gate electrode and a second spacer on a side wall of the first offset-spacer, and doping a dopant of the conductivity type opposite to the conductivity type of the semiconductor substrate into the semiconductor substrate to form a second source region and a second drain region at positions deeper than the first source region and the first drain region in the semiconductor substrate.

BRIEF DESCRIPTION OF THE SEVERAL VIEWS OF THE DRAWING

FIG. 10 is a sectional view schematically showing still another step of the semiconductor device manufacturing method according to the first embodiment of the present invention;

FIG. 11 is a sectional view schematically showing a semiconductor device according to the second embodiment of the present invention;

FIG. 12 is a sectional view schematically showing one step of a semiconductor device manufacturing method according to the second embodiment of the present invention;

FIG. 22 is a sectional view schematically showing another step of the semiconductor device manufacturing method according to the fourth embodiment of the present invention;.

FIG. 23 is a sectional view schematically showing a semiconductor device according to the first modification of the present invention;

FIG. 24 is a sectional view schematically showing one step of a semiconductor device manufacturing method according to the first modification of the present invention;

DETAILED DESCRIPTION OF THE INVENTION

Figure 1:
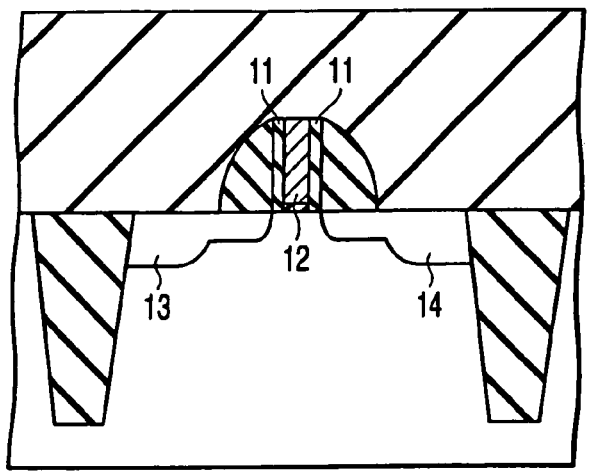
FIG. 1 is a sectional view showing a conventional semiconductor device.
Figure 2:
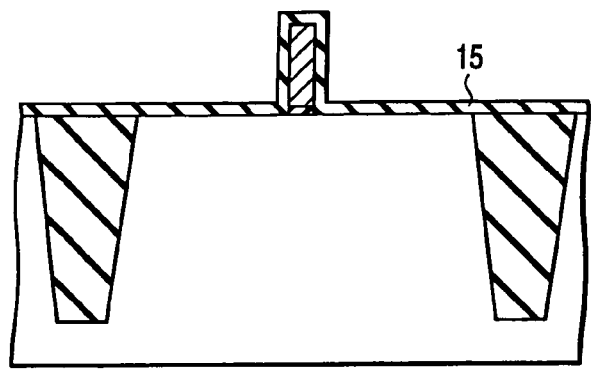
FIG. 2 is a sectional view showing one step of a conventional semiconductor device manufacturing method.
Figure 3:
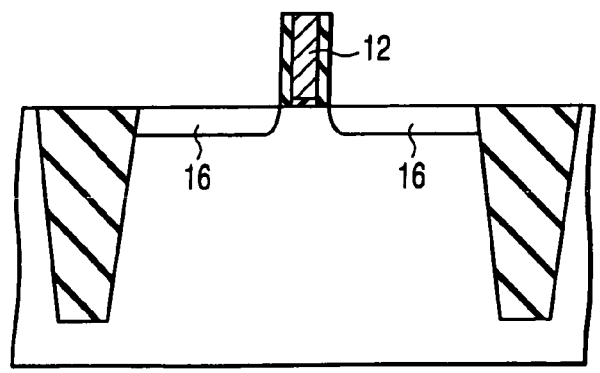
FIG. 3 is a sectional view showing another step of the conventional semiconductor device manufacturing method.

Preferred embodiments of the present invention will be described below with reference to the several views of the accompanying drawing. In the following description, the same reference numerals denote the same parts throughout the accompanying drawing.

First Embodiment

Figure 4:
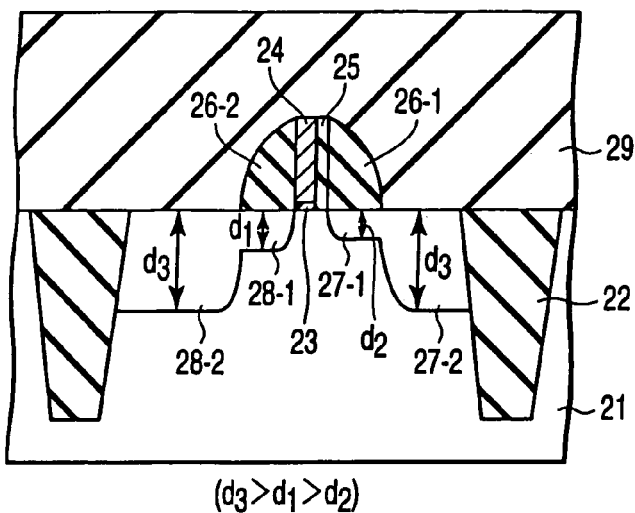
FIG. 4 is a sectional view schematically showing a semiconductor device according to the first embodiment of the present invention.

A semiconductor device and manufacturing method thereof according to the first embodiment of the present invention will be explained with reference to FIGS. 4 to 10. FIG. 4 is a sectional view schematically showing the semiconductor device according to the first embodiment.

As shown in FIG. 4, a gate insulating film 23 is formed on the major surface of a semiconductor substrate 21 that is divided by element isolation regions 22. A gate electrode 24 is formed on the gate insulating film 23. An offset-spacer 25 is formed in contact with one side surface of the gate electrode 24 on the semiconductor substrate 21. A spacer (second spacer) 26-1 is formed in contact with one side surface of the offset-spacer 25. A spacer (first spacer) 26-2 is formed in contact with the other side surface of the gate electrode 24. An interlayer dielectric film 29 is formed on the entire major surface of the semiconductor substrate 21.

A total film thickness of the offset-spacer 25 and spacer 26-1 which are formed as one side wall of the gate electrode 24 is larger than the film thickness of the spacer 26-2 serving as the other side wall.

The width of the gate electrode 24 along the channel is, e.g., about 20 nm to 40 nm. The width of the offset-spacer 25 along the channel is, e.g., about 6 nm. The offset-spacer is formed from a TEOS (Tetra Ethyl Ortho Silicate) film, silicon nitride (SiN) film, SiC film, or the like.

A dopant diffusion region (first drain region) 27-1 of a conductivity type opposite to that of the semiconductor substrate 21 is formed in the semiconductor substrate 21 below the spacer 26-1 so as to sandwich the gate electrode 24 and offset-spacer 25 between itself and a corresponding dopant diffusion region (to be described later). A dopant diffusion region (second drain region) 27-2 is formed adjacent to the dopant diffusion region 27-1.

A dopant diffusion region (first source region) 28-1 of the conductivity type opposite to that of the semiconductor substrate 21 is formed in the semiconductor substrate 21 below the spacer 26-2 so as to sandwich the gate electrode 24 and offset-spacer 25 between itself and the dopant diffusion region 27-1. A dopant diffusion region (second source region) 28-2 is formed adjacent to the dopant diffusion region 28-1.

The dopant diffusion region 28-1 is formed at a position d1 deeper than a position d2 at which the dopant diffusion region 27-1 is formed. The dopant diffusion region 28-1 is higher in concentration than the dopant diffusion region 27-1. The dopant diffusion region 28-2 is formed at a position d3 deeper than the position d1 at which the dopant diffusion region 28-1 is formed. The dopant diffusion region 28-2 is higher in concentration than the dopant diffusion region 28-1. The dopant diffusion region 27-2 is formed at the position d3, and is higher in concentration than the dopant diffusion region 27-1.

That is, the dopant diffusion regions 28-2, 28-1, 27-2, and 27-1 have a positional relation: d3>d1>d2. For example, it is desirable that d1 is about 25 nm, d2 is about 15 nm, and d3 is about 90 nm.

In operation, the dopant diffusion regions 27-1 and 27-2 act as a drain which receives a predetermined potential. The dopant diffusion regions 28-1 and 28-2 act as a source which receives a predetermined fixed potential (e.g., Vss or Vdd).

As described above, the offset-spacer 25 is formed in contact with the side surface of the gate electrode 24 on the drain side. The offset-spacer 25 separates the gate electrode 24 and the dopant diffusion regions 27-1 and 27-2 apart from each other even when the electric field is applied to them. Formation of the depletion layer on the drain side is suppressed, relaxing the short-channel effect on the drain side.

The shallow dopant diffusion regions (extension regions) 27-1 and 28-1 have a so-called LDD (Lightly Doped Drain) structure in which they are shallower and lower in concentration than the dopant diffusion regions 27-2 and 28-2. This can avoid concentration of the electric field near the contact between the dopant diffusion region 27-1 and the offset-spacer 25 and the contact between the dopant diffusion region 28-1 and the gate insulating film 23. The above structure can prevent punch-through which may occur between the dopant diffusion regions 27-2 and 28-2 at the position d3 even in a semiconductor device with a very small channel length of about 20 nm. For this reason, this structure is effective for a micropatterned semiconductor device.

The dopant diffusion region 27-1 serving as a drain which receives a potential is formed at the shallowest position d2 with a low concentration. The dopant diffusion region 27-1 can suppress the spread of the depletion layer and relax the short-channel effect.

The dopant diffusion region 28-1 is formed at the position d1 deeper than the position d2 at which the dopant diffusion region 27-1 is formed. The dopant diffusion region 28-1 has a concentration higher than that of the dopant diffusion region 27-1. Accordingly, the resistance value and parasitic resistance of the dopant diffusion region 28-1 can be reduced.

A semiconductor device manufacturing method according to the first embodiment of the present invention will be explained with reference to FIGS. 5 to 10 by exemplifying the semiconductor device shown in FIG. 4.

Figure 5:
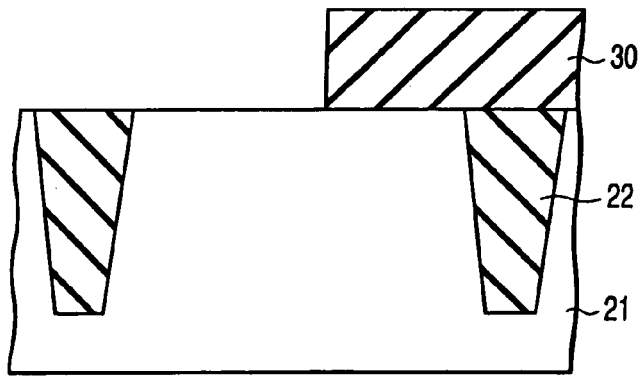
FIG. 5 is a sectional view schematically showing one step of a semiconductor device manufacturing method according to the first embodiment of the present invention.

As shown in FIG. 5, element isolation films 22 are formed in a semiconductor substrate 21 by a known step. A dopant is selectively doped into the semiconductor substrate 21 to form a well region and adjust the threshold.

A dummy pattern layer for forming the gate. electrode 24 is formed. A silicon nitride film is deposited to about 100 nm on the entire surface by, e.g., CVD (Chemical Vapor Deposition). A photoresist is applied to the silicon nitride film to form by, e.g., photolithography a pattern (not shown) which leaves the silicon nitride film only on a prospective drain region. The entire surface is anisotropically etched by, e.g., RIE (Reactive Ion Etching) using the photoresist as a mask and the semiconductor substrate 21 as a stop layer, thereby anisotropically etching the silicon nitride film. The photoresist is removed to form a silicon nitride film 30 as a dummy pattern layer. A gate electrode is formed on the side surface of the silicon nitride film 30 serving as a dummy pattern layer.

Figure 6:
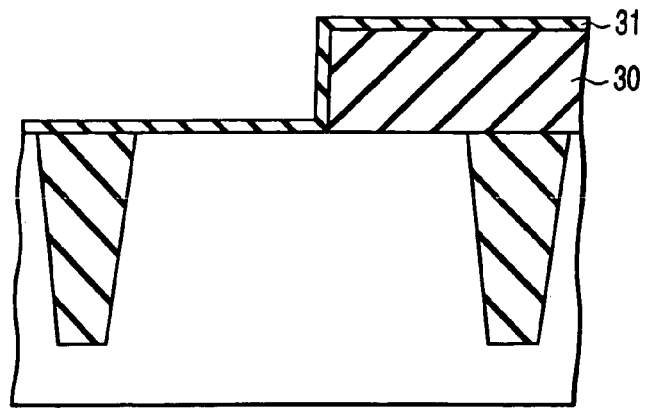
FIG. 6 is a sectional view schematically showing another step of the semiconductor device manufacturing method according to the first embodiment of the present invention.

As shown in FIG. 6, a silicon oxide film 31 is deposited by, e.g., CVD on the semiconductor substrate and silicon nitride film 30.

Figure 7:
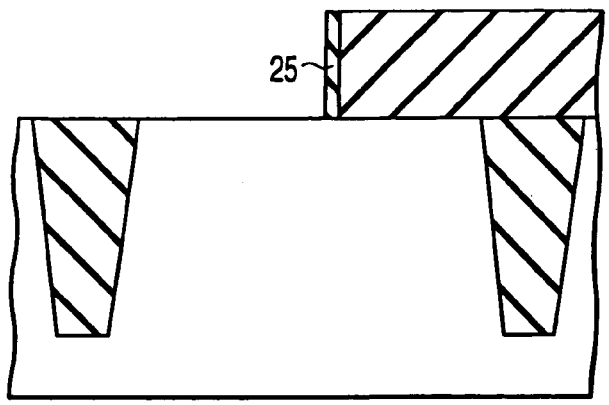
FIG. 7 is a sectional view schematically showing still another step of the semiconductor device manufacturing method according to the first embodiment of the present invention.

As shown in FIG. 7, the entire surface is anisotropically etched by, e.g., RIE to etch the silicon oxide film 31. As a result, an offset-spacer 25 is formed in contact with the side wall of the silicon nitride film 30.

Figure 8:
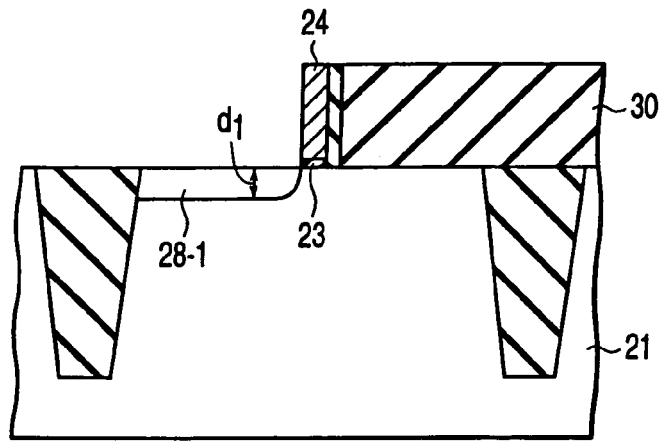
FIG. 8 is a sectional view schematically showing still another step of the semiconductor device manufacturing method according to the first embodiment of the present invention.

Subsequently, gate oxidation is performed by, e.g., thermal oxidation to form a silicon oxide film about 10 nm thick on the entire surface. Polysilicon is deposited to about 30 nm as a gate electrode on the semiconductor substrate 21 by, e.g., CVD. As shown in FIG. 8, the entire surface is anisotropically etched by, e.g., RIE to form a gate insulating film 23 and gate electrode 24 in self-alignment.

While the silicon nitride film 30 serving as a dummy pattern layer is left, a dopant is doped to form a shallow dopant diffusion region (extension region). More specifically, a dopant of a conductivity type opposite to that of the semiconductor substrate 21 is doped by, e.g., ion implantation using the silicon nitride film 30 of the dummy pattern layer as a mask, thus forming a dopant diffusion region 28-1 in the semiconductor substrate 21. In the ion implantation step, the dopant diffusion region 28-1 is so formed as to reach the shallow position d1 in the semiconductor substrate 21 by, for example, selecting the acceleration voltage. In this step, the silicon nitride film 30 serves as a mask, and prevents doping of any dopant into the semiconductor substrate 21 in a region where the silicon nitride film 30 serving as a dummy pattern layer exists.

Figure 9:
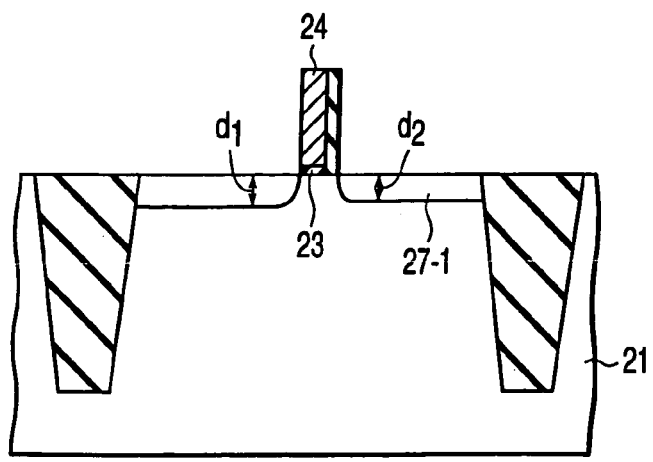
FIG. 9 is a sectional view schematically showing still another step of the semiconductor device manufacturing method according to the first embodiment of the present invention.

As shown in FIG. 9, the silicon nitride film 30 serving as a dummy pattern layer is removed. A dopant of the conductivity type opposite to that of the semiconductor substrate 21 is doped again into the entire surface by, e.g., ion implantation to form a dopant diffusion region 27-1. In the ion implantation step, the lightly doped dopant diffusion region 27-1 is formed at the shallow position d2 in the semiconductor substrate 21 by, for example, selecting a lower acceleration voltage than in the ion implantation step of forming the dopant diffusion region 28-1. The dopant diffusion region 28-1 is formed at a dopant concentration higher than that of the dopant diffusion region 27-1 without changing the depth d1.

As shown in FIG. 10, a TEOS film or the like is deposited by, e.g., CVD on the semiconductor substrate 21, gate electrode 24, and offset-spacer 25. The TEOS film or the like is etched back by RIE and left on the side walls of the gate electrode 24, forming spacers 26-1 and 26-2. A dopant of the conductivity type opposite to that of the semiconductor substrate 21 is doped into the entire surface by, e.g., ion implantation using the spacers 26-1 and 26-2 as a mask, forming dopant diffusion regions 27-2 and 28-2 in the semiconductor substrate 21. In the ion implantation step, the dopant diffusion regions 27-2 and 28-2 are so formed as to reach the deep position d3 in the semiconductor substrate 21 by, for example, selecting a high acceleration voltage. In this step, dopant diffusion regions with a so-called LDD structure are formed in the semiconductor substrate 21 below the spacers 26-1 and 26-2. Next, a silicon oxide film or the like is deposited on the entire surface by, e.g., CVD to form an interlayer dielectric film 29. Through these steps, a semiconductor device shown in FIG. 4 can be manufactured.

As described above, the shallow dopant diffusion region (extension region) 28-1 is formed using the silicon nitride film 30 of the dummy pattern layer as a mask. The dopant diffusion region 28-1 can be formed independently of the drain side at a high dopant concentration at the position d1 by, for example, selecting a high application voltage. The shallow dopant diffusion region (extension region) 27-1 is formed after the silicon nitride film 30 is removed. Also in this step, the dopant diffusion region 27-1 can be independently formed at a low dopant concentration at the position d2 by, for example, selecting a low application voltage. The position, concentration, and the like optimal for various purposes, e.g., to relax the short-channel effect can therefore be easily selected for the dopant diffusion regions 27-1 and 28-1.

The deep dopant diffusion regions 27-2 and 28-2 are formed in self-alignment using the spacers 26-1 and 26-2 as a mask. The dopant diffusion regions 27-2 and 28-2 can be formed independently of the shallow dopant diffusion regions 27-1 and 28-1 at a high dopant concentration at the deep position d3 by, for example, selecting a high application voltage. Hence, the position, concentration, and the like can be easily selected.

In the step of forming the offset-spacer 25, the material 31 of the offset-spacer 25 is independently formed. For example, by selecting the reaction conditions of the material 31, a desired material, film thickness, and the like can be easily selected for the offset-spacer 25 capable of relaxing the short-channel effect.

In the above manner, the material, position, concentration, and the like can be independently set for the shallow dopant diffusion regions 27-1 and 28-1, deep dopant diffusion regions 27-2 and 28-2, and offset-spacer 25. This provides high selectivities of the offset-spacer 25 and dopant diffusion regions 27-1, 27-2, 28-1, and 28-2. Optimal values can be selected to improve the reliability.

As described above, the semiconductor device according to the first embodiment can sufficiently relax the short-channel effect and improve the reliability.

The semiconductor device manufacturing method according to the first embodiment can increase the selectivities of the offset-spacer and dopant diffusion regions. Thus, optimal values can be selected to increase the reliability.

Second Embodiment

A semiconductor device and manufacturing method thereof according to the second embodiment of the present invention will be explained with reference to FIGS. 11 to 16. FIG. 11 is a sectional view schematically showing the semiconductor device according to the second embodiment. In the following description, a description which overlaps the first embodiment will be omitted.

As shown in FIG. 11, a gate insulating film 23 is formed on the major surface of a semiconductor substrate 21 that is divided by element isolation regions 22. A gate electrode 24 is formed on the gate insulating film 23. An offset-spacer 25 is formed in contact with one side surface of the gate electrode 24 on the semiconductor substrate 21. A spacer 26-1 is formed in contact with the side surface of the offset-spacer 25. A spacer 26-2 is formed in contact with the other side surface of the gate electrode 24. An interlayer dielectric film 29 is formed on the entire major surface of the semiconductor substrate 21.

Dopant diffusion regions 28, 27-1, and 27-2 of a conductivity type opposite to that of the semiconductor substrate 21 are formed in the semiconductor substrate 21 below the-spacers 26-2 and 26-1. The dopant diffusion region 28 is formed at a position d4 deeper than the dopant diffusion regions 27-1 and 27-2 at a higher concentration. The dopant diffusion region 27-2 is formed at a position d5 shallower than the dopant diffusion region 28 at a lower concentration. That is, the position d4 at which the dopant diffusion region 28 is formed and the position d5 at which the dopant diffusion region 27-2 is formed have a relation: d4>d5. The dopant diffusion region 27-1 is formed at a position shallower than the dopant diffusion region 27-2 at the lowest concentration.

In operation, the dopant diffusion regions 27-1 and 27-2 act as a drain which receives a predetermined potential. The dopant diffusion region 28 acts as a source which receives a predetermined fixed potential (e.g., Vss or Vdd).

As described above, the offset-spacer 25 is formed in contact with the side surface of the gate electrode 24 on the drain side. The offset-spacer 25 separates the gate electrode 24 and the dopant diffusion regions 27-1 and 27-2 apart from each other even when the electric field is applied to them. Formation of the depletion layer on the drain side is suppressed, relaxing the short-channel effect on the drain side.

Of dopant diffusion regions serving as a drain, the dopant diffusion region 27-1 has a so-called LDD structure in which it is shallower than the dopant diffusion region 27-2 and lower in concentration. This can avoid concentration of the electric field near the contact between the dopant diffusion region 27-1 and the offset-spacer 25, thus relaxing the short-channel effect on the drain side.

The dopant diffusion region 28 is formed at the deep position d4 with a high concentration. This structure can reduce the resistance value and parasitic resistance of the dopant diffusion region 28, and suppress formation of the depletion layer. Thus, the short-channel effect on the source side can be relaxed.

A semiconductor device manufacturing method according to the second embodiment of the present invention will be explained with reference to FIGS. 12 to 16 by exemplifying the semiconductor device shown in FIG. 11. Since the second embodiment adopts the offset-spacer 25 in contact with one side surface of the gate electrode 24, as described above, a method of manufacturing a semiconductor device having different right and left side wall thicknesses will be described.

As shown in FIG. 12, element isolation films 22 are formed in a semiconductor substrate 21 by a known step. A dopant is selectively doped into the semiconductor substrate 21 to form a well region and adjust the threshold.

A dummy pattern layer for forming the gate electrode 24 is formed. A silicon nitride film is deposited to about 100 nm on the entire surface by, e.g., CVD. A photoresist is applied to the silicon nitride film to form by, e.g., photolithography a pattern (not shown) which leaves the silicon nitride film only on a prospective drain region. The entire surface is anisotropically etched by, e.g., RIE using the photoresist as a mask and the semiconductor substrate 21 as a stop layer, thereby anisotropically etching the silicon nitride film. The photoresist is removed to form a silicon nitride film 30 as a dummy pattern layer. A gate electrode is formed on the side surface of the silicon nitride film 30 serving as a dummy pattern layer.

Figure 13:
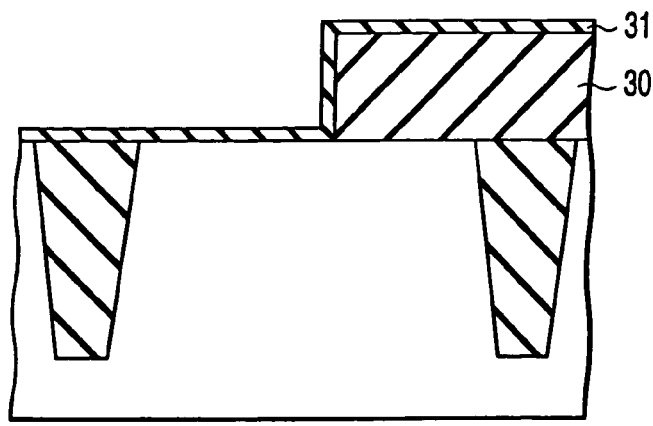
FIG. 13 is a sectional view schematically showing another step of the semiconductor device manufacturing method according to the second embodiment of the present invention.

As shown in FIG. 13, a silicon oxide film 31 is deposited by, e.g., CVD on the semiconductor substrate and silicon nitride film 30.

Figure 14:
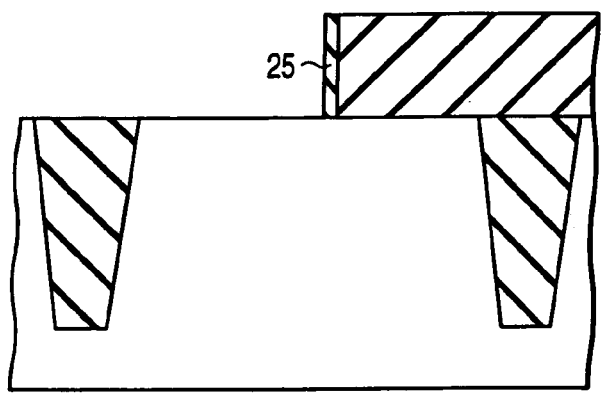
FIG. 14 is a sectional view schematically showing still another step of the semiconductor device manufacturing method according to the second embodiment of the present invention.

As shown in FIG. 14, the entire surface is anisotropically etched by, e.g., RIE to etch the silicon oxide film 31. As a result, an offset-spacer 25 is formed in contact with the side wall of the silicon nitride film 30.

Figure 15:
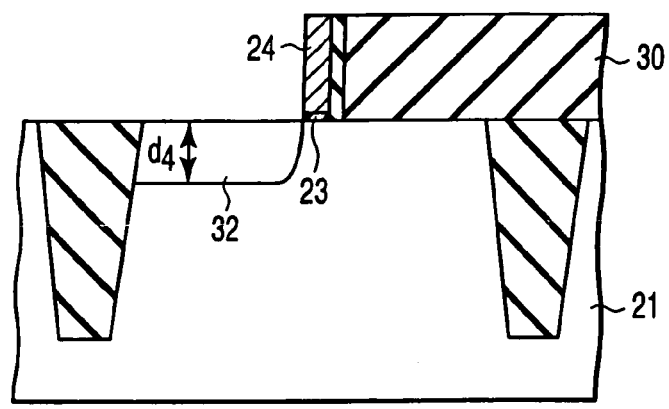
FIG. 15 is a sectional view schematically showing still another step of the semiconductor device manufacturing method according to the second embodiment of the present invention.

Subsequently, gate oxidation is performed by, e.g., thermal oxidation to form a silicon oxide film about 10 nm thick on the entire surface. Polysilicon is deposited to about 30 nm as a gate electrode on the semiconductor substrate 21 by, e.g., CVD. As shown in FIG. 15, the entire surface is anisotropically etched by, e.g., RIE to form a gate insulating film 23 and gate electrode 24 in self-alignment.

While the silicon nitride film 30 serving as a dummy pattern layer is left, a dopant is doped to form a shallow dopant diffusion region (extension region). More specifically, a dopant of a conductivity type opposite to that of the semiconductor substrate 21 is doped by, e.g., ion implantation using the silicon nitride film 30 of the dummy pattern layer as a mask, forming a dopant diffusion region 32 in the semiconductor substrate 21. In the ion implantation step, the dopant diffusion region 32 is so formed as to reach the deep position d4 in the semiconductor substrate 21 by, for example, selecting a high acceleration voltage. In this step, the silicon nitride film 30 acts as a mask and prevents doping of any dopant into the semiconductor substrate 21 in a region where the silicon nitride film 30 serving as a dummy pattern layer exists.

Figure 16:
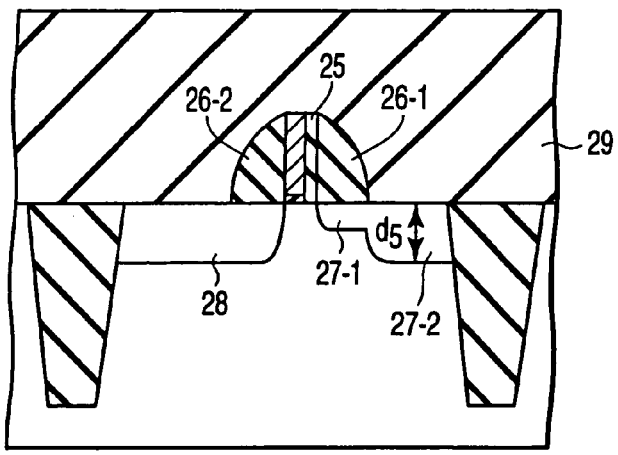
FIG. 16 is a sectional view schematically showing still another step of the semiconductor device manufacturing method according to the second embodiment of the present invention.

As shown in FIG. 16, the silicon nitride film 30 serving as a dummy pattern layer is removed. A dopant of the conductivity type opposite to that of the semiconductor substrate 21 is doped again into the entire surface by, e.g., ion implantation to form dopant diffusion regions 27-1 and 28. In the ion implantation step, the lightly doped dopant diffusion region 27-1 is formed at a shallow position in the semiconductor substrate 21 by, for example, selecting a low acceleration voltage. By repetitively doping a dopant, the dopant diffusion region 28 is formed at a concentration higher than that of the dopant diffusion region 27-1.

A TEOS film or the like is deposited by, e.g., CVD on the semiconductor substrate 21 gate electrode 24, and offset-spacer 25. The TEOS film or the like is etched back by RIE and left on the side walls of the gate electrode 24, forming spacers 26-1 and 26-2. A dopant of the conductivity type opposite to that of the semiconductor substrate 21 is doped into the entire surface by, e.g., ion implantation using the spacers 26-1 and 26-2 as a mask, forming a dopant diffusion region 27-2 in the semiconductor substrate 21. In the ion implantation step, the dopant diffusion region 27-2 is so formed as to reach the shallow position d5 in the semiconductor substrate 21 by, for example, selecting a low acceleration voltage. In this step, a dopant diffusion region with a so-called LDD structure is formed in the semiconductor substrate 21 only below the spacer 26-2. Next, a silicon oxide film or the like is deposited on the entire surface by, e.g., CVD to form an interlayer dielectric film 29. Through these steps, a semiconductor device shown in FIG. 11 can be manufactured.

The dopant diffusion region 27-1 which is formed below the silicon nitride film 30 serving as a dummy pattern layer and acts as part of the drain region exhibits a profile defined by one dopant doping process. To the contrary, the dopant diffusion region 28 serving as a source region exhibits a profile defined by at least two dopant doping processes.

By these steps, the dopant diffusion region 28 serving as a source is formed at the deep position d4. The dopant concentration of the dopant diffusion region 28 can be set higher than that of the dopant diffusion regions 27-1 and 27-2 serving as a drain. The resistance value and parasitic resistance of the dopant diffusion region 28 can be reduced. As a result, the resistance of the dopant diffusion region 28 serving as a source can be suppressed low without changing the electric field applied to the dopant diffusion regions 27-1 and 27-2 serving as a drain.

The offset-spacer 25, gate electrode 24, and dopant diffusion region 28 are formed after the silicon nitride film 30 of the dummy pattern layer is formed. In the step of forming the offset-spacer 25, for example, reaction conditions are selected. Accordingly, a desired material, film thickness, and the like can be easily selected for the offset-spacer 25 capable of relaxing the short-channel effect. In the step of forming the dopant diffusion region 28, the silicon nitride film 30 of the dummy pattern layer is employed as a mask. The dopant diffusion region 28 can be formed independently of the dopant diffusion regions 27-1 and 27-2 at a high dopant concentration at the deep position d4 by, e.g., selecting a high application voltage.

In this way, the material, film thickness, position, and the like can be independently set for the offset-spacer 25 and dopant diffusion region 28. The selectivities of the offset-spacer 25 and dopant diffusion region 28 can be increased, and optimal values can be selected, thus improving the reliability.

Third Embodiment

A semiconductor device and manufacturing method thereof according to the third embodiment of the present invention will be explained with reference to FIGS. 17 to 19. In the following description of the embodiment, a description which overlaps the second embodiment will be omitted, and a difference will be explained in detail.

Figure 17:
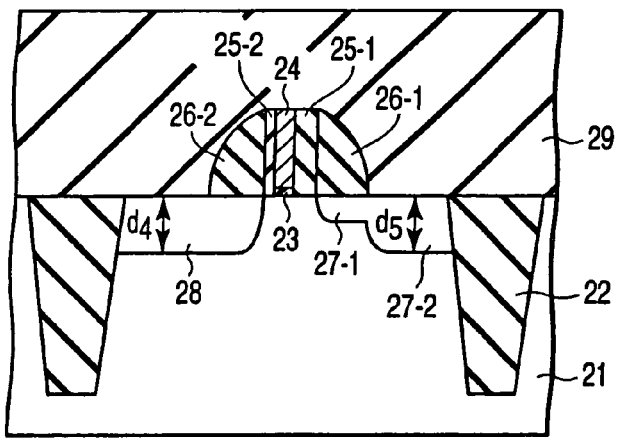
FIG. 17 is a sectional view schematically showing a semiconductor device according to the third embodiment of the present invention.

FIG. 17 is a sectional view schematically showing an example of the semiconductor device according to the third embodiment of the present invention. In the embodiment shown in FIG. 17, first and second offset-spacers 25-1 and 25-2 are respectively formed in contact with the two side surfaces of a gate electrode 24.

The width of the gate electrode 24 along the channel is, e.g., about 40 nm. The width of the first offset-spacer 25-1 along the channel is, e.g., about 12 nm. The width of the second offset-spacer is, e.g., about 5 nm. As described above, the width of the first offset-spacer 25-1 is desirably almost equal to or larger than that of a second offset-spacer 25-2.

The first and second offset-spacers 25-1 and 25-2 are formed from a TEOS (Tetra Ethyl Ortho Silicate) film, silicon nitride (SiN) film, SiC film, or the like. The first and second offset-spacers 25-1 and 25-2 can also be formed from the same material or a combination of different materials.

This structure can attain the same effects as those of the second embodiment. Since the second offset-spacer 25-2 is formed on the side of a dopant diffusion region 28 serving as a source, the short-channel effect in the dopant diffusion region 28 can be relaxed. Since the width of the first offset-spacer 25-1 is larger than that of the second spacer 25-2, the spread of the depletion layer in dopant diffusion regions 27-1 and 27-2 can be suppressed, further relaxing the short-channel effect.

A semiconductor device manufacturing method according to the third embodiment will be explained with reference to FIGS. 18 and 19 by exemplifying the semiconductor device shown in FIG. 17.

Figure 18:
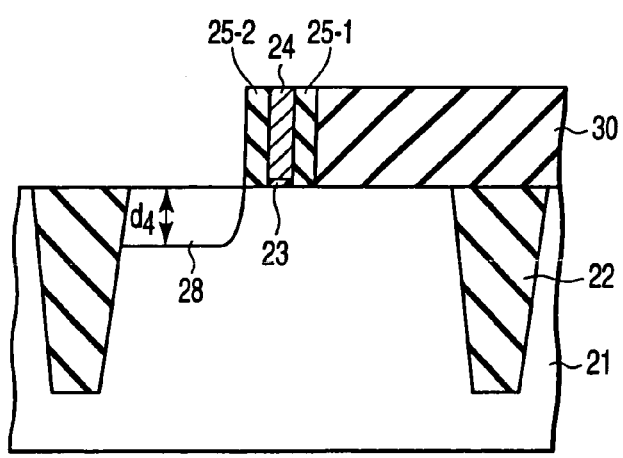
FIG. 18 is a sectional view schematically showing one step of a semiconductor device manufacturing method according to the third embodiment of the present invention.

As shown in FIG. 18, element isolation films 22, a gate insulating film 23, a gate electrode 24, a first offset-spacer 25-1, and a silicon nitride film 30 serving as a dummy pattern layer are formed on the major surface of a semiconductor substrate 21 by the same steps as those in the second embodiment.

A silicon oxide film is deposited to about 5 nm by, e.g., CVD on the semiconductor substrate 21, gate electrode 24, first offset-spacer 25-1, and silicon nitride film 30. As shown in FIG. 18, the deposited silicon oxide film is anisotropically etched by, e.g., RIE to form a second offset-spacer 25-2 in contact with the side wall of the gate electrode. By selecting reaction conditions and the like in CVD, the material and film thickness of the second offset-spacer 25-2 can be set independently of the material type and film thickness of the first offset-spacer 25-1 which is formed first.

A dopant of a conductivity type opposite to that of the semiconductor substrate 21 is doped by, e.g., ion implantation using the first and second offset-spacers 25-1 and 25-2, the gate electrode 24, and the silicon nitride film 30 as a mask, thereby forming a dopant diffusion region 28 in the substrate 21. In the ion implantation step, a dopant is doped to the deep position d4 in the semiconductor substrate 21 by, for example, selecting a high acceleration voltage.

Figure 19:
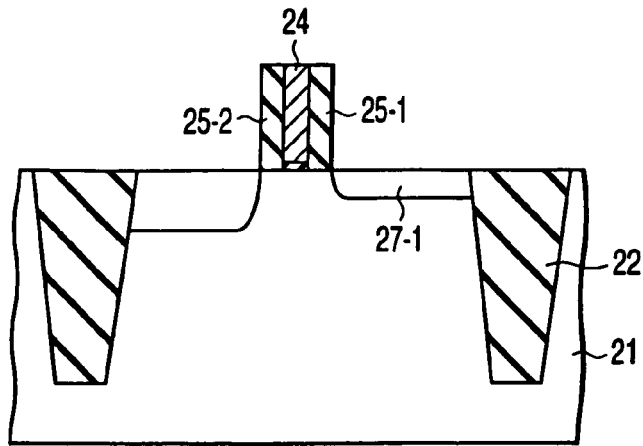
FIG. 19 is a sectional view schematically showing another step of the semiconductor device manufacturing method according to the third embodiment of the present invention.

As shown in FIG. 19, the silicon nitride film 30 serving as a dummy pattern layer is selectively etched away. A dopant diffusion region 27-1 is formed in the semiconductor substrate 21 by, e.g., ion implantation using the gate electrode 24 and the first and second offset-spacers 25-1 and 25-2 as a mask. In the ion implantation step, a dopant is doped to a shallow position in the semiconductor substrate 21 at a low concentration by, for example, selecting a low acceleration voltage.

Thereafter, a semiconductor device having a structure in which the film thickness of the offset-spacer is different between the right and left of the gate electrode 24 shown in FIG. 17 can be manufactured by the same steps as those in the second embodiment.

These steps can realize the same effects as those of the second embodiment. In the step of forming the second offset-spacer 25-2, for example, reaction conditions and the like in CVD are selected. The material, film thickness, and the like can therefore be set independently of the material type and film thickness of the first offset-spacer 25-1 which is formed first.

Moreover, the materials and film thicknesses of the first and second offset-spacers 25-1 and 25-2 can be independently set in accordance with the strength of the electric field applied to the dopant diffusion regions 27-1 and 27-2 serving as a drain region and the dopant diffusion region 28 serving as a source region.

As a result, the selectivities of the dopant diffusion regions 28, 27-1, and 27-2, first offset-spacer 25-1, and second offset-spacer 25-2 can be increased without increasing the manufacturing cost. Optimal values can be selected to improve the reliability.

Fourth Embodiment

Figure 20:
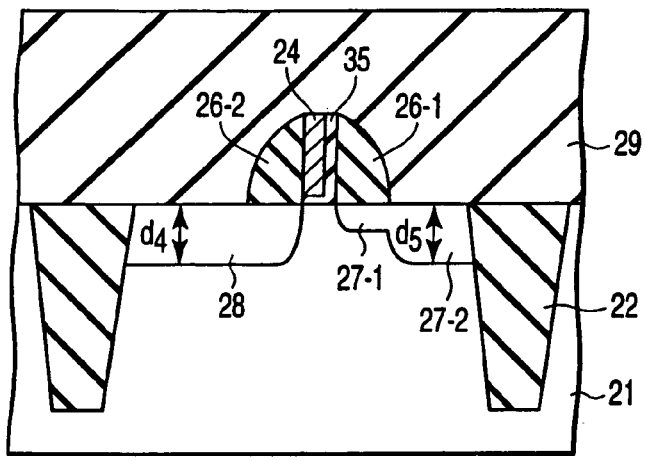
FIG. 20 is a sectional view schematically showing a semiconductor device according to the fourth embodiment of the present invention.

A semiconductor device and manufacturing method thereof according to the fourth embodiment will be explained with reference to FIGS. 20 to 22. FIG. 20 is a sectional view schematically showing an example of the semiconductor device according to the fourth embodiment. In the following description, a description which overlaps the second embodiment will be omitted.

As shown in FIG. 20, according to the fourth embodiment, an insulating film 35 is formed in contact with the lower and side surfaces of a gate electrode 24 on the major surface of a semiconductor substrate 21. The insulating film 35 is formed by integrating the above-mentioned offset-spacer and gate insulating film by the same material. For this reason, the insulating film 35 acts as an offset-spacer and gate insulating film.

The insulating film 35 is desirably formed from a high-permittivity deposition type insulating film such as a TEOS film, silicon nitride film, or HfON film serving as a so-called High-k material. The width of the insulating film 35 along the channel is, e.g., about 3 nm which is desirably smaller than the width of the offset-spacer described in the above embodiments.

This structure can achieve the same effects as those of the second embodiment. Since the insulating film 35 is narrower than the offset-spacer described in the third embodiment, the pitch in the channel direction can be reduced.

When the insulating film 35 is formed from a high-permittivity deposition type insulating film such as an HfON film serving as a so-called High-k material, the effective film thickness of the gate insulating film can be increased to reduce the overlap capacitance of the gate electrode 24. This can prevent the leakage current and increase the reliability.

A semiconductor device manufacturing method according to the fourth embodiment will be explained with reference to FIGS. 21 and 22.

Figure 21:
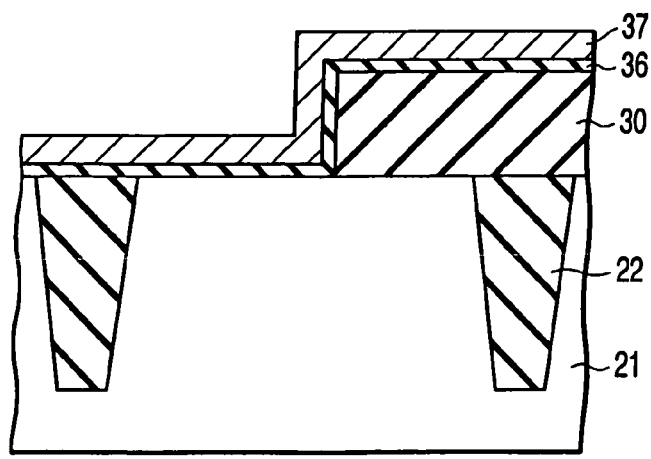
FIG. 21 is a sectional view schematically showing one step of a semiconductor device manufacturing method according to the fourth embodiment of the present invention.

As shown in FIG. 21, element isolation films 22 and a silicon nitride film 30 serving as a dummy pattern layer are formed on the major surface of a semiconductor substrate 21 by the same step as that in the above embodiments.

For example, a hafnium silicate film 36 is deposited as a high-permittivity deposition type insulating film by, e.g., CVD on the semiconductor substrate 21 and silicon nitride film 30. For example, a polysilicon film 37 is deposited as a gate electrode by, e.g., CVD on the hafnium silicate film 36.

As shown in FIG. 22, the entire surface is anisotropically etched by, e.g., RIE to simultaneously form a gate electrode 24 and an insulating film 35 serving as a gate insulating film and offset.

After that, a semiconductor device shown in FIG. 20 can be manufactured by the same steps as those in the second embodiment.

This manufacturing method can provide the same effects as those of the second embodiment. Since the insulating film 35 serving as a gate insulating film and offset is simultaneously formed, the manufacturing steps can be omitted to reduce the manufacturing cost.

When a high-permittivity deposition type insulating film is used as the insulating film 35 in forming a gate electrode 24 with a very small gate length of about 10 nm or less by, e.g., a damascene technique, deposition type gate insulating films exist on the two sides of the gate electrode. However, according to the fourth embodiment, a deposition type gate insulating film exists on only one side of the gate electrode. The overlap capacitance of the gate electrode can be reduced.

[First Modification]

A semiconductor device and manufacturing method thereof according to the first modification of the present invention will be explained with reference to FIGS. 23 to 25. FIG. 23 is a sectional view schematically showing an example of the semiconductor device according to the first modification. In the following description, a description which overlaps the second embodiment will be omitted.

As shown in FIG. 23, in the first modification, an insulating film 35 is formed in contact with the lower surface and one side surface of the gate electrode 24 on the major surface of the semiconductor substrate 21. The insulating film 35 acts as the above-mentioned offset-spacer and gate insulating film which are integrated by the same material. The insulating film 35 is formed from a high-permittivity deposition type insulating film such as a TEOS film, silicon nitride film, or HfON film serving as a so-called High-k material. The offset-spacer 25 is formed in contact with the side surface of the gate electrode 24 on the source side.

This structure can obtain the same effects as those of the fourth embodiment. Since the offset-spacer 25 is formed in contact with the side surface of the gate electrode 24 on the source side, the short-channel effect of the dopant diffusion region 28 serving as a source can be relaxed. Thus, the reliability can be further improved.

When a high-permittivity deposition type material is used as the insulating film 35, it is formed on only one side of the gate electrode 24, as described in the fourth embodiment. The overlap capacitance can be reduced in comparison with a case in which the gate electrode 24 is formed by, e.g., a damascene technique.

A semiconductor device manufacturing method according to the first modification will be explained with reference to FIGS. 24 and 25 by exemplifying the semiconductor device shown in FIG. 23.

As shown in FIG. 24, element isolation films 22, a silicon nitride film 30 serving as a dummy pattern layer, an insulating film 35, and a gate electrode 24 are formed on the major surface of a semiconductor substrate 21 by the same steps as those in the above embodiments.

A silicon oxide film (not shown) is deposited by, e.g., CVD on the semiconductor substrate 21, gate electrode 24, insulating film 35, and silicon nitride film 30. The entire surface is anisotropically etched by, e.g., RIE to form an offset-spacer 25 in contact with the side surface of the gate electrode 24.

A dopant diffusion region 28 is then formed by the same step as that in the above embodiments.

Figure 25:
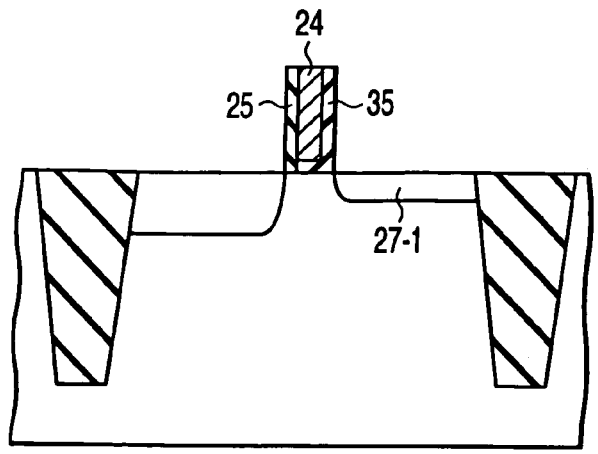
FIG. 25 is a sectional view schematically showing another step of the semiconductor device manufacturing method according to the first modification of the present invention.

As shown in FIG. 25, the silicon nitride film 30 is removed by the same step as that in the above embodiments. Further, a dopant of a conductivity type opposite to that of the semiconductor substrate 21 is doped into the entire surface by, e.g., ion implantation using the gate electrode 24, offset-spacer 25, and insulating film 35 as a mask, thus forming a dopant diffusion region 27-1 in the substrate 21.

A semiconductor device as shown in FIG. 23 can be manufactured by the same steps as those in the above embodiments.

This manufacturing method can provide the same effects as those of the above embodiments. The offset-spacer 25 is formed after the insulating film 35 is formed, as shown in FIG. 24. The insulating material and film thickness of the insulating film 35 can be easily set as far as the film thickness necessary to act as a gate insulating film is ensured. Independently of this, the material and film thickness of the offset-spacer 25 can be set. These settings can be independently performed without changing the design to suppress the short-channel effect by the dopant diffusion region 28. The insulating film 35 serving as a gate insulating film and an offset-spacer on the drain side can be formed. Consequently, the selectivities of the offset-spacer 25 and insulating film 35 can be increased, and optimal values can be selected to improve the reliability.

[Second Modification]

Figure 26:
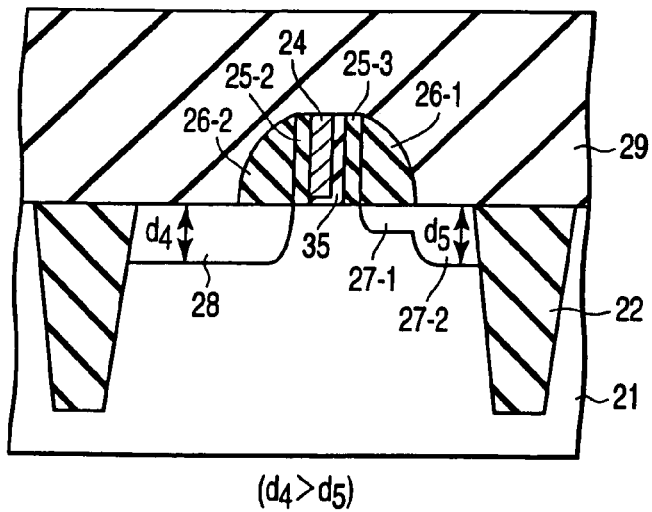
FIG. 26 is a sectional view schematically showing a semiconductor device according to the second modification of the present invention.

A semiconductor device and manufacturing method thereof according to the second modification of the present invention will be explained with reference to FIGS. 26 to 28. FIG. 26 is a sectional view schematically showing an example of the semiconductor device according to the second modification.

As shown in FIG. 26, the second modification employs the insulating film 35 serving as a gate insulating film and first offset-spacer, the second offset-spacer 25-2, and a third offset-spacer 25-3.

The insulating film 35 is formed in contact with the lower and side surfaces of the gate electrode 24 on the major surface of the semiconductor substrate 21. The insulating film 35 acts as an offset-spacer and gate insulating film which are integrated by the same material. The insulating film 35 is desirably formed from a high-permittivity deposition type insulating film such as a TEOS film, silicon nitride film, or HfON film serving as a so-called High-k material. The width of the insulating film 35 along the channel is, e.g., about 3 nm.

The third offset-spacer 25-3 is formed in contact with the insulating film 35 on the major surface of the semiconductor substrate 21. The width of the third offset-spacer 25-3 along the channel is, e.g., about 12 nm.

The second offset-spacer 25-2 is formed in contact with the side surface of the gate electrode 24 and the insulating film 35 on the major surface of the semiconductor substrate 21. The width of the second offset-spacer 25-2 along the channel is, e.g., about 6 nm. The second and third offset-spacers 25-2 and 25-3 are formed from a TEOS film, silicon nitride (SiN) film, SiC film, or the like.

A total width of the insulating film 35 and third offset-spacer 25-3 is desirably almost equal to or larger than the width of the second offset-spacer 25-2.

This structure can achieve the same effects as those of the above embodiments and modification. Further, the short-channel effect of the source or drain can be relaxed. Especially when a high-permittivity deposition type material is used for the insulating film 35, the film thickness necessary to act as a gate insulating film can be minimized. In addition, the second and third offset-spacers 25-2 and 25-3 can ensure film thicknesses enough to separate the gate electrode 24 and dopant diffusion regions 28 and 27-1 apart from each other. This structure is therefore effective for micropatterning and reduction of the short-channel effect.

A semiconductor device manufacturing method according to the second modification will be explained with reference to FIGS. 27 and 28 by exemplifying the semiconductor device shown in FIG. 26.

Figure 27:
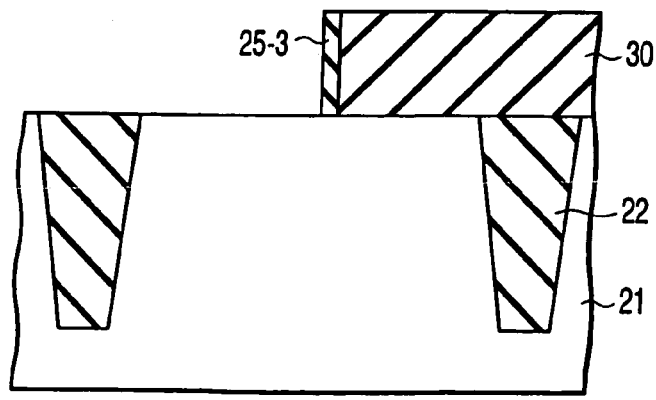
FIG. 27 is a sectional view schematically showing one step of a semiconductor device manufacturing method according to the second modification of the present invention.

As shown in FIG. 27, element isolation films 22, and a silicon nitride film 30 serving as a dummy pattern layer are formed on the major surface of a semiconductor substrate 21 by the same steps as those in the above embodiments and modification. A silicon oxide film is deposited by, e.g., CVD on the entire surface, and the entire surface is anisotropically etched by RIE to form a third offset-spacer 25-3 on one side.

Figure 28:
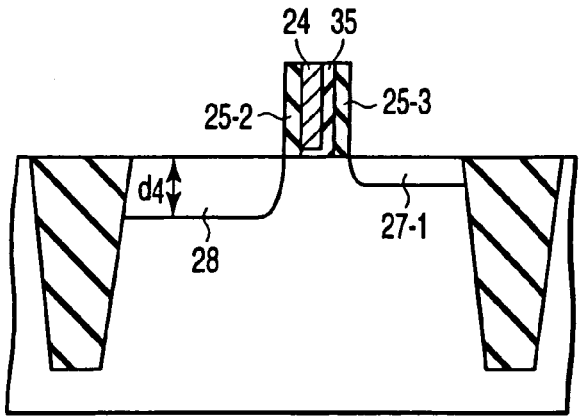
FIG. 28 is a sectional view schematically showing another step of the semiconductor device manufacturing method according to the second modification of the present invention.

As shown in FIG. 28, an insulating film 35 and gate electrode 24 are formed by the same steps as those in the above embodiments and modification.

By the same steps as those in the above embodiments and modification, a second offset-spacer 25-2 and dopant diffusion region 28 are formed. The silicon nitride film 30 serving as a dummy pattern layer is removed, and then a dopant diffusion region 27-1 is formed by the same step as that in the above embodiments and modification.

In the step of forming the insulating film 35, reaction conditions and the like are desirably selected so that the insulating film 35 becomes thinner than the second offset-spacer 25-2 and third offset-spacer 25-3 while a high-permittivity deposition type material such as an HfON film is used in, e.g., CVD.

A semiconductor device as shown in FIG. 26 can be manufactured by the same steps as those in the above embodiments and modification.

This manufacturing method can provide the same effects as those of the above embodiments and modification. As shown in FIGS. 27 and 28, the step of forming the second offset-spacer 25-2, the step of forming the insulating film 35, and the step of forming the third offset-spacer 25-3 can be independently executed. For this reason, the film thickness, material, and the like can be independently set, increasing the selectivities of the second and third offset-spacers 25-2 and 25-3, insulating film 35, and dopant diffusion region 28. Optimal values can be selected to improve the reliability.

[Third Modification]

A semiconductor device according to the third modification of the present invention will be explained with reference to FIGS. 29 to 32. FIG. 29 to 32 are sectional views each schematically showing an example of the semiconductor device according to the third modification.

The offset-spacers 25-1, 25-2, and 25-3, the insulating film 35, and a combination of these offset-spacers can also be applied to a semiconductor device (FIG. 4) according to the first embodiment. An application of the offset-spacer to the semiconductor device according to the first embodiment will be explained.

Figure 29:
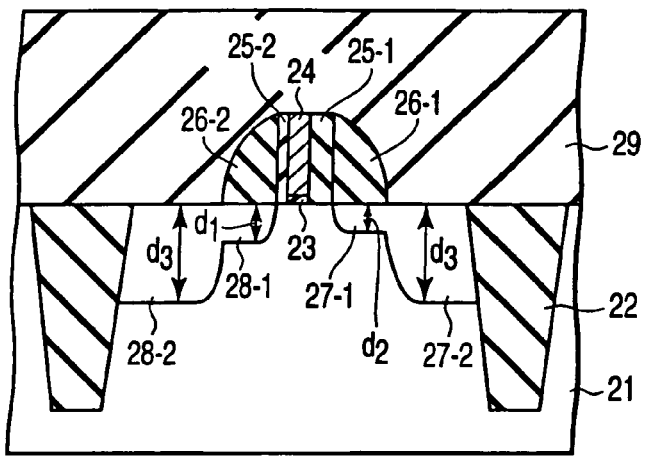
FIG. 29 is a sectional view schematically showing a semiconductor device according to the third modification of the present invention.

In the semiconductor device shown in FIG. 29, the offset-spacer 25-2 is formed between the spacer 26-2 and the gate electrode 24.

Figure 30:
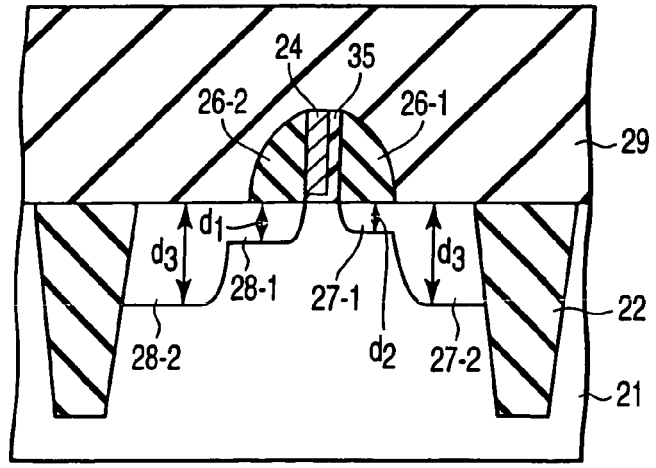
FIG. 30 is a sectional view schematically showing another semiconductor device according to the third modification of the present invention.

The semiconductor device shown in FIG. 30 comprises the insulating film 35 as an integration of a gate insulating film and offset-spacer.

Figure 31:
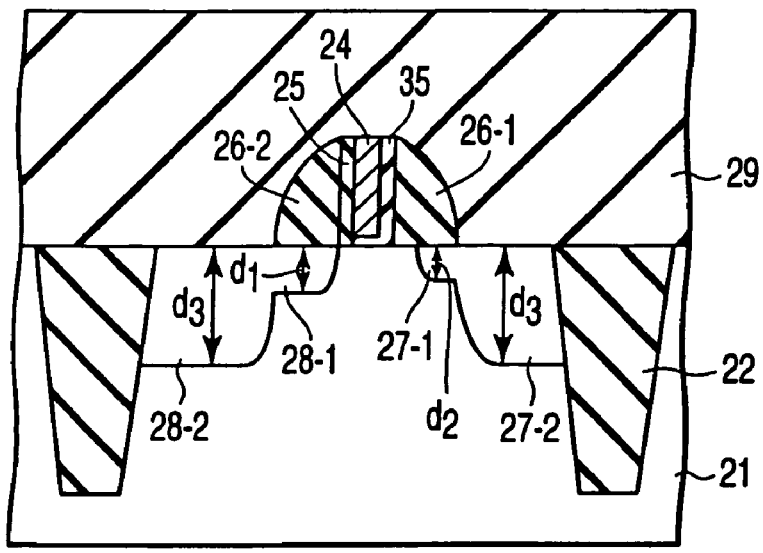
FIG. 31 is a sectional view schematically showing still another semiconductor device according to the third modification of the present invention.

In the semiconductor device shown in FIG. 31, the insulating film 35 is formed on one side surface of the gate electrode 24, and the offset-spacer 25 is formed on the other side surface of the gate electrode 24.

Figure 32:
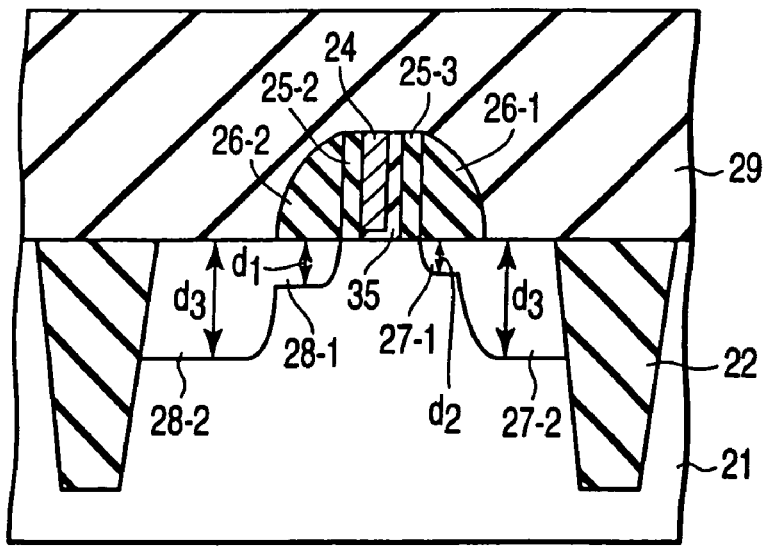
FIG. 32 is a sectional view schematically showing still another semiconductor device according to the third modification of the present invention.

In the semiconductor device shown in FIG. 32, the offset-spacer 25-3 is formed on the side surface of the insulating film 35 in the semiconductor device shown in FIG. 31.

The semiconductor devices shown in FIGS. 29 to 32 can attain the same effects as those described above. Also, the reliability can be increased because values optimal for, e.g., sufficiently relaxing the short-channel effect can be selected and the offset-spacers 25-1, 25-2, and 25-3, the insulating film 35, and a combination of them can be selected. The manufacturing method is the same as that described above, and a description thereof will be omitted.

Fifth Embodiment

Figure 33:
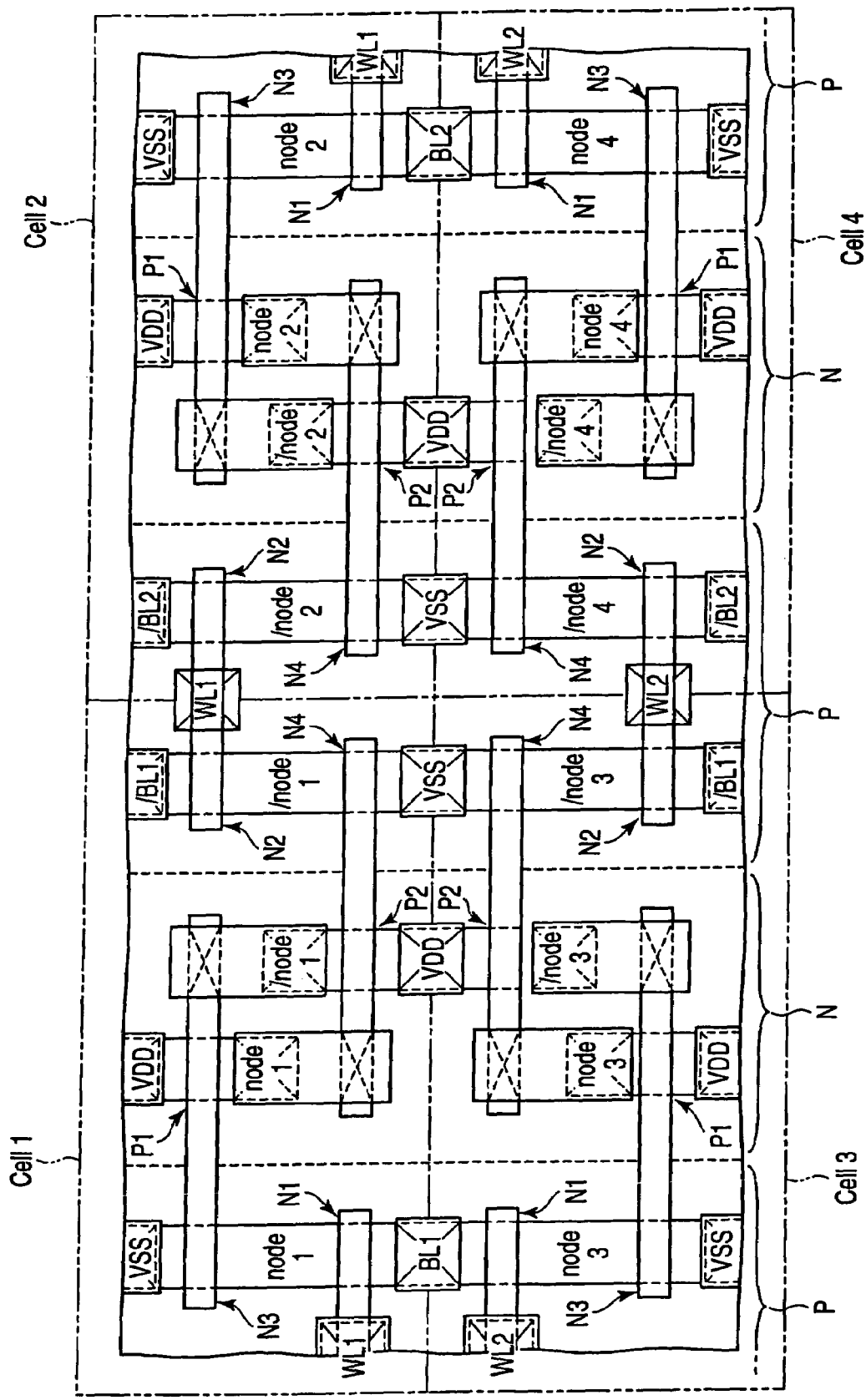
FIG. 33 is a plan view schematically showing a semiconductor device according to the fifth embodiment of the present invention.

A semiconductor device and manufacturing method thereof according to the fifth embodiment of the present invention will be explained with reference to FIGS. 33 to 46. FIG. 33 is a plan view schematically showing the memory cell array of the semiconductor device according to the fifth embodiment. As shown in FIG. 33, the semiconductor device according to the fifth embodiment includes four SRAMs (Static Random Access Memories) (Cell 1 to Cell 4).

Figure 34:
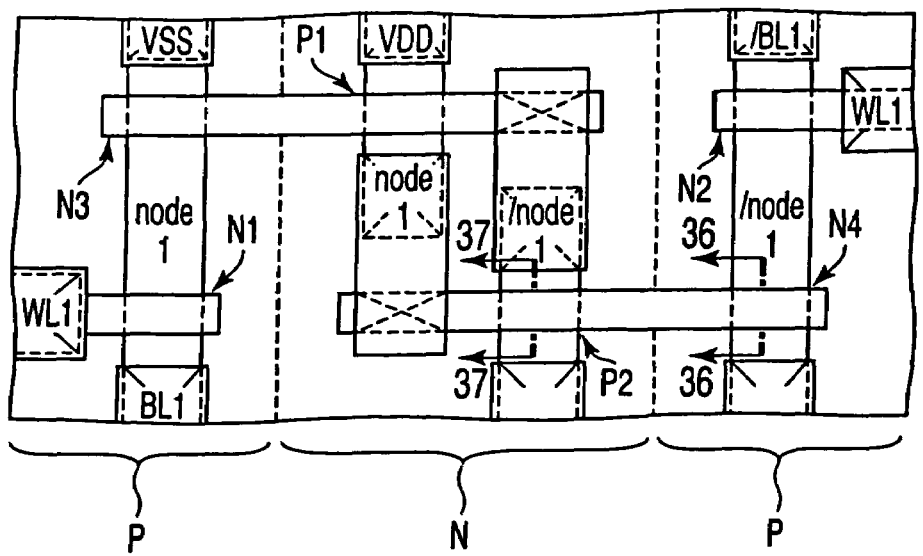
FIG. 34 is a plan view schematically showing Cell 1 in FIG. 33.
Figure 35:
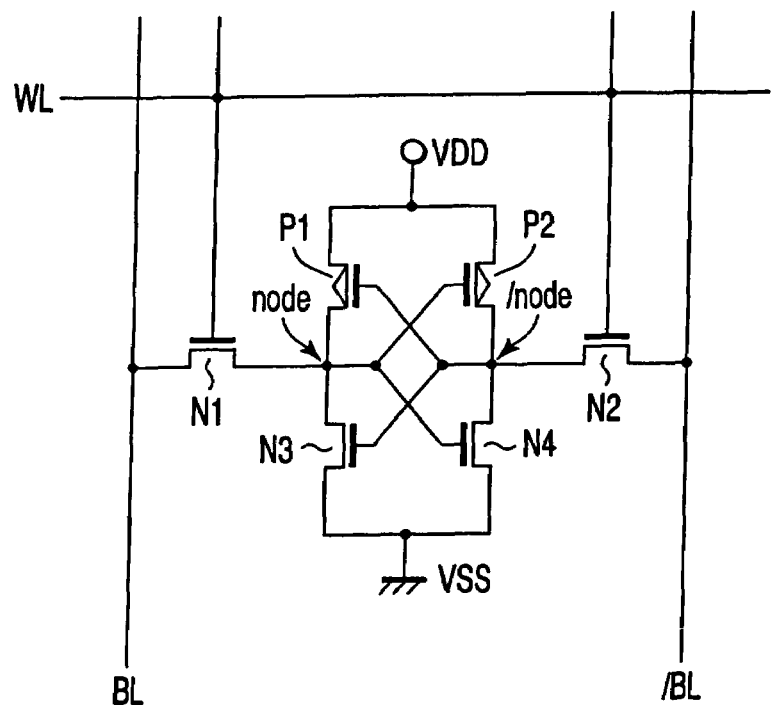
FIG. 35 is an equivalent circuit diagram showing Cell 1 in FIG. 33.

The structure of the semiconductor device according to the fifth embodiment will be explained by extracting Cell 1 in FIG. 33. FIG. 34 is a plan view showing the extracted Cell 1 surrounded by a broken line in FIG. 33. FIG. 35 is an equivalent circuit diagram showing Cell 1 surrounded by the broken line in FIG. 33.

As shown in FIG. 34, an SRAM represented by Cell 1 is formed by NMOS transistors N1, N2, N3, and N4 and PMOS transistors P1 and P2. The NMOS transistors N1 to N4 and PMOS transistors P1 and P2 each comprise an offset-spacer 25 and dopant diffusion regions 27-1, 27-2, and 28 as shown in FIG. 11. The sectional structure will be described with reference to FIGS. 36 and 37.

Figure 36:
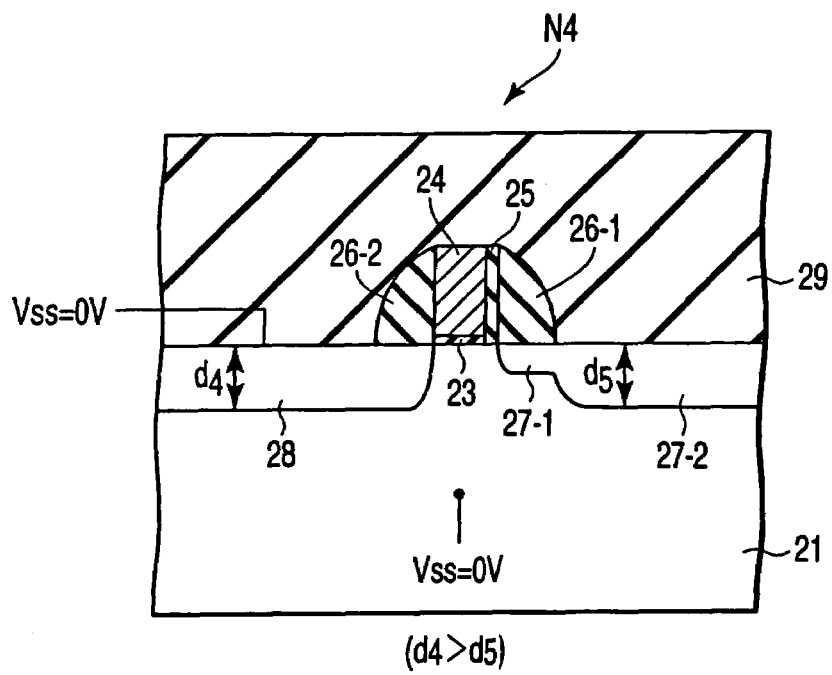
FIG. 36 is a sectional view showing the semiconductor device when viewed from the arrow along the line 36-36 in FIG. 34.
Figure 37:
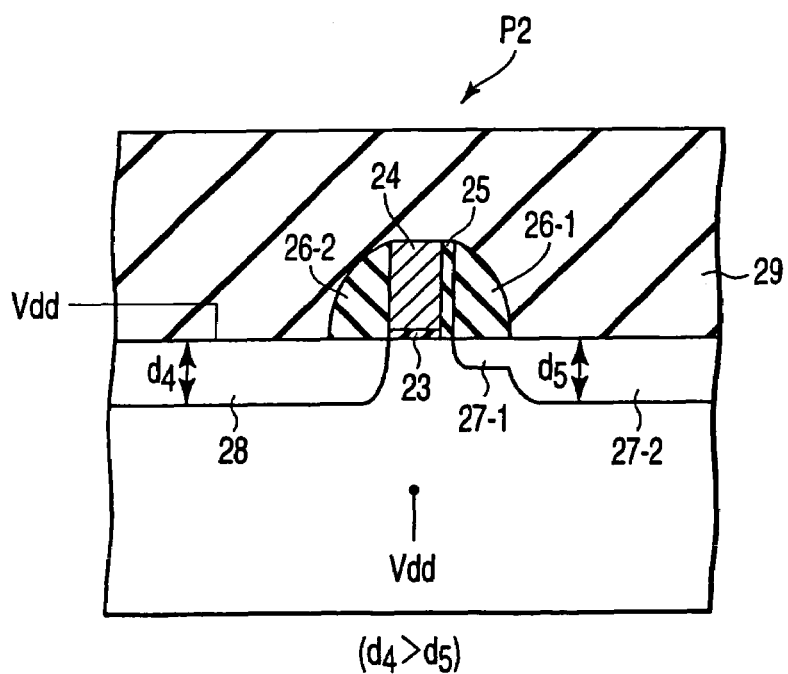
FIG. 37 is a sectional view showing the semiconductor device when viewed from the arrow along the line 37-37 in FIG. 34.

FIG. 36 is a sectional view showing the semiconductor device when viewed from the arrow along the line 36-36 in FIG. 34. FIG. 37 is a sectional view showing the semiconductor device when viewed from the arrow along the line 37-37 in FIG. 34. As shown in FIGS. 36 and 37, the NMOS transistors N1 to N4 and PMOS transistors P1 and P2 which are applied to the SRAM adopt a semiconductor device according to the second embodiment.

As described above, the NMOS transistors N1 and N2 have a structure as shown in FIG. 36, and exhibit the same effects as those of the second embodiment. The switching characteristics of the NMOS transistors N1 and N2 can be improved, and thus the switching characteristic of the whole SRAM can be improved.

A semiconductor device manufacturing method according to the fifth embodiment will be described with reference to FIGS. 38 to 46 by exemplifying the semiconductor device shown in FIG. 33.

Figure 38:
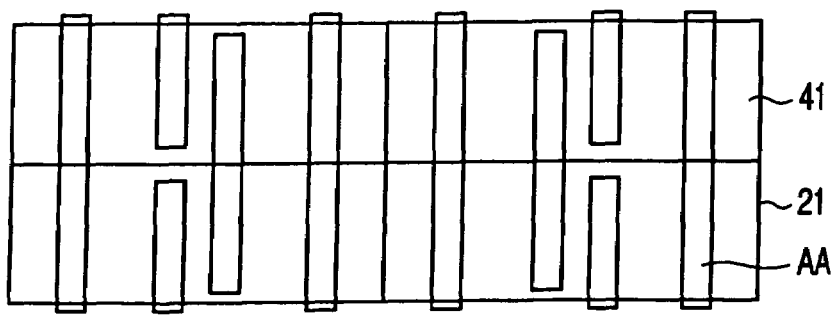
FIG. 38 is a sectional view schematically showing one step of a semiconductor device manufacturing method according to the fifth embodiment of the present invention.

As shown in FIG. 38, element isolation regions 41 are formed in the major surface of a semiconductor substrate 21 by a known step. Element regions AA are formed in the column direction.

Figure 39:
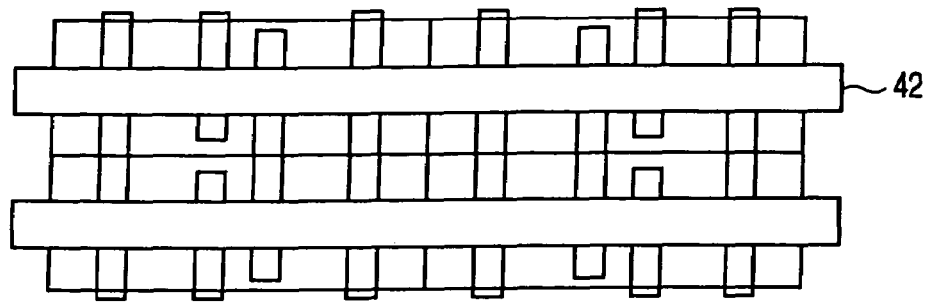
FIG. 39 is a sectional view schematically showing another step of the semiconductor device manufacturing method according to the fifth embodiment of the present invention.

As shown in FIG. 39, SiN films (silicon nitride films) 42 of dummy pattern layers each serving as a mask are formed in Cell 1 to Cell 4 by, e.g., CVD in the row direction.

Figure 40:
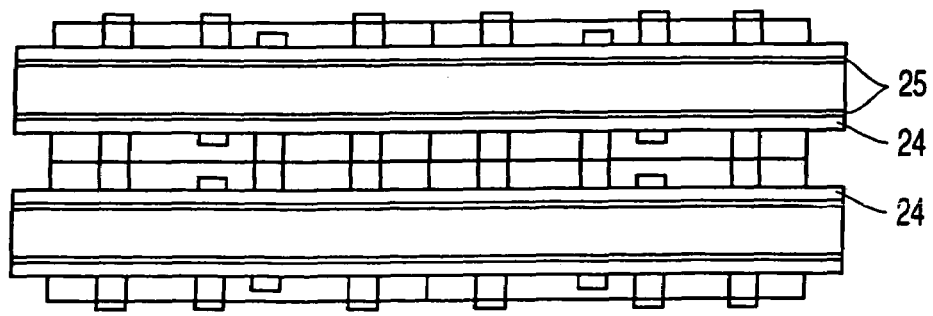
FIG. 40 is a sectional view schematically showing still another step of the semiconductor device manufacturing method according to the fifth embodiment of the present invention.

As shown in FIG. 40, a TEOS film or the like is deposited on the entire surface by, e.g., CVD. The entire surface is anisotropically etched by, e.g., RIE to form offset-spacers 25 in contact with the SiN film of the dummy pattern layer on one side. Further, a silicon oxide film (not shown) is formed on the entire surface by, e.g., thermal oxidization. Polysilicon is deposited on the entire surface by, e.g., CVD. The entire surface is anisotropically etched by, e.g., RIE to form gate electrodes 24 and gate insulating films in self-alignment.

Figure 41:
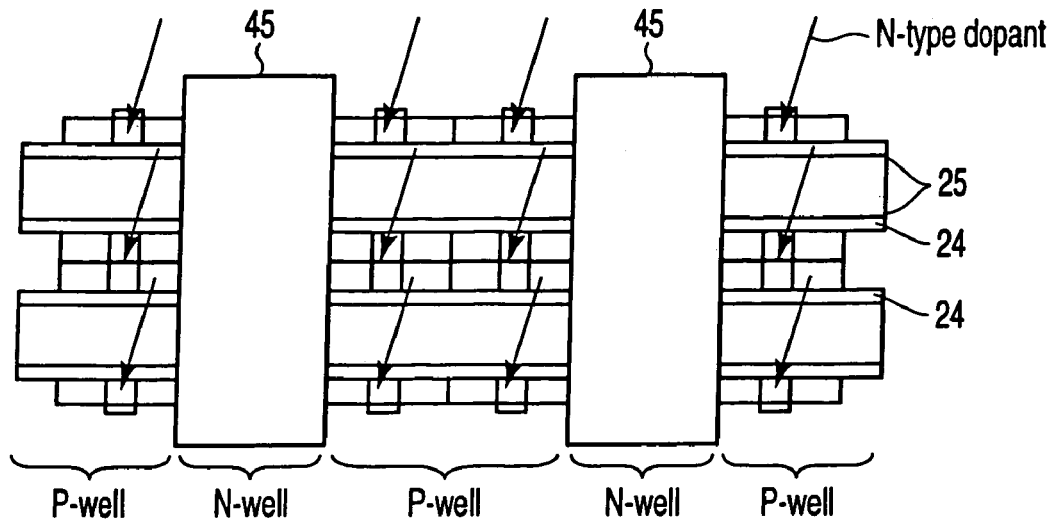
FIG. 41 is a sectional view schematically showing still another step of the semiconductor device manufacturing method according to the fifth embodiment of the present invention.

As shown in FIG. 41, a photoresist is applied to the entire surface, exposed, and developed to form a photoresist 45 which remains in only each N-well region. An N-type dopant such as P (Phosphorus) or A (Arsenic) is doped by, e.g., ion implantation using the photoresist 45 as a mask, and thermally diffused to form a dopant diffusion region in the element region AA of each P-well region.

Figure 42:
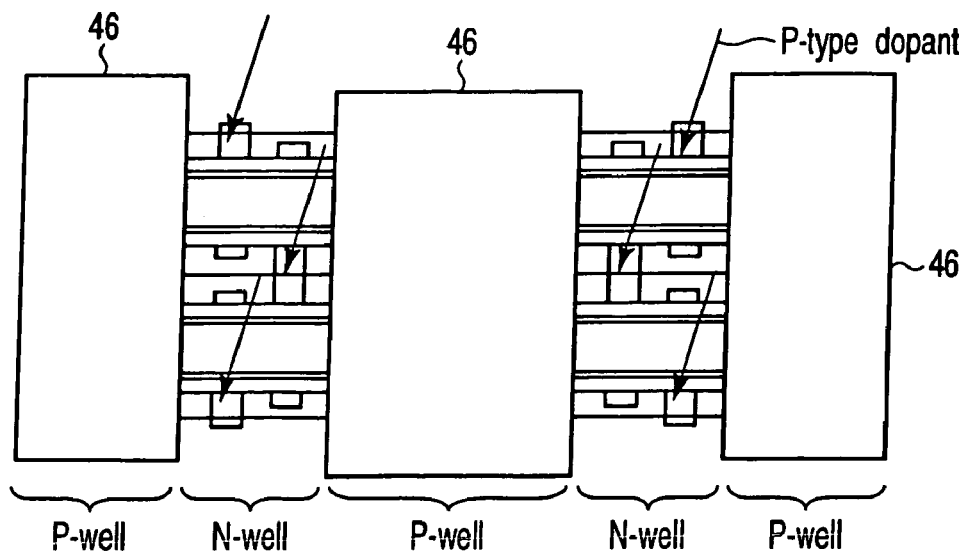
FIG. 42 is a sectional view schematically showing still another step of the semiconductor device manufacturing method according to the fifth embodiment of the present invention.

After the photoresist 45 is removed, a photoresist is applied to the entire surface, exposed, and developed to form a photoresist 46 which remains in only each P-well region, as shown in FIG. 42. A P-type dopant such as B (Boron) is doped into the entire surface by, e.g., ion implantation using the photoresist 46 as a mask, and thermally diffused to form a dopant diffusion region in the element region AA of each N-well region.

Figure 43:
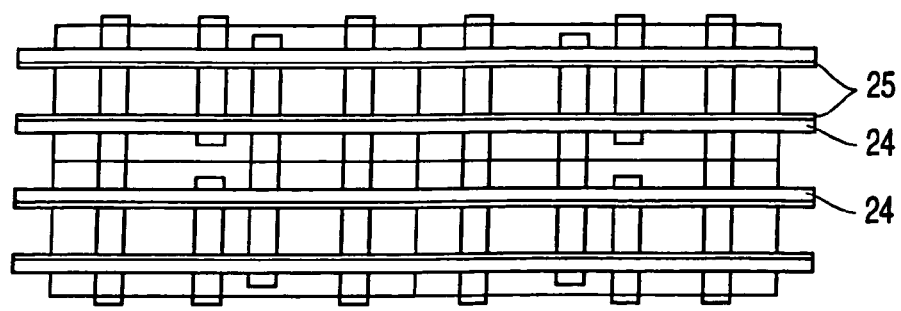
FIG. 43 is a sectional view schematically showing still another step of the semiconductor device manufacturing method according to the fifth embodiment of the present invention.

As shown in FIG. 43, the photoresist 46 and the silicon nitride film 42 serving as a dummy pattern layer are removed. As shown in FIG. 43, the offset-spacers 25 are formed along one side wall of a corresponding gate electrode 24 so as to face each other.

Figure 44:
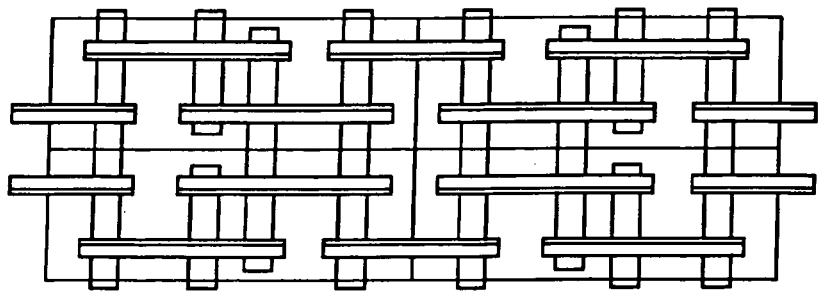
FIG. 44 is a sectional view schematically showing still another step of the semiconductor device manufacturing method according to the fifth embodiment of the present invention.

As shown in FIG. 44, element regions AA are formed by a known method including RIE.

Figure 45:
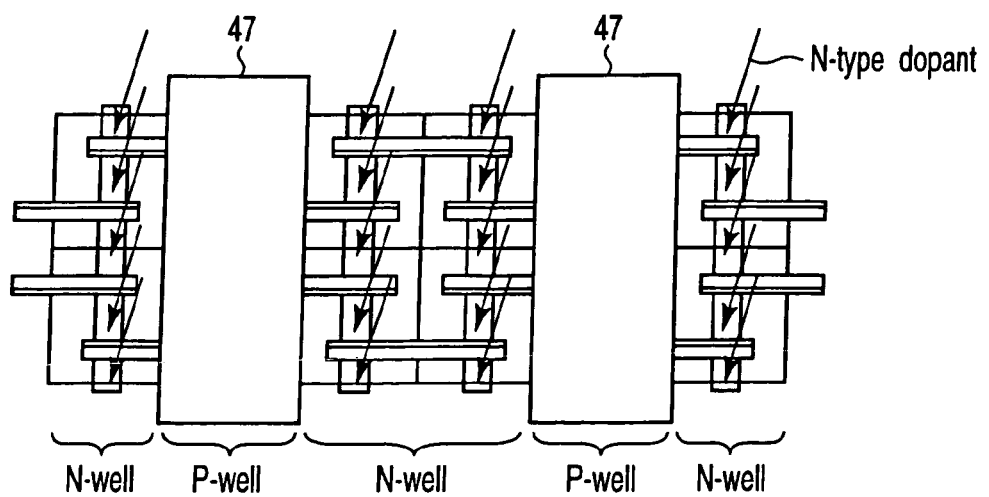
FIG. 45 is a sectional view schematically showing still another step of the semiconductor device manufacturing method according to the fifth embodiment of the present invention.

As shown in FIG. 45, a photoresist is applied to the entire surface, exposed, and developed to form a photoresist 47 which remains in only each P-well region. An N-type dopant such as P (Phosphorus) or A (Arsenic) is doped into the entire surface by, e.g., ion implantation using the photoresist 47 as a mask, and thermally diffused to form a dopant diffusion region in the element region AA of each N-well region.

Figure 46:
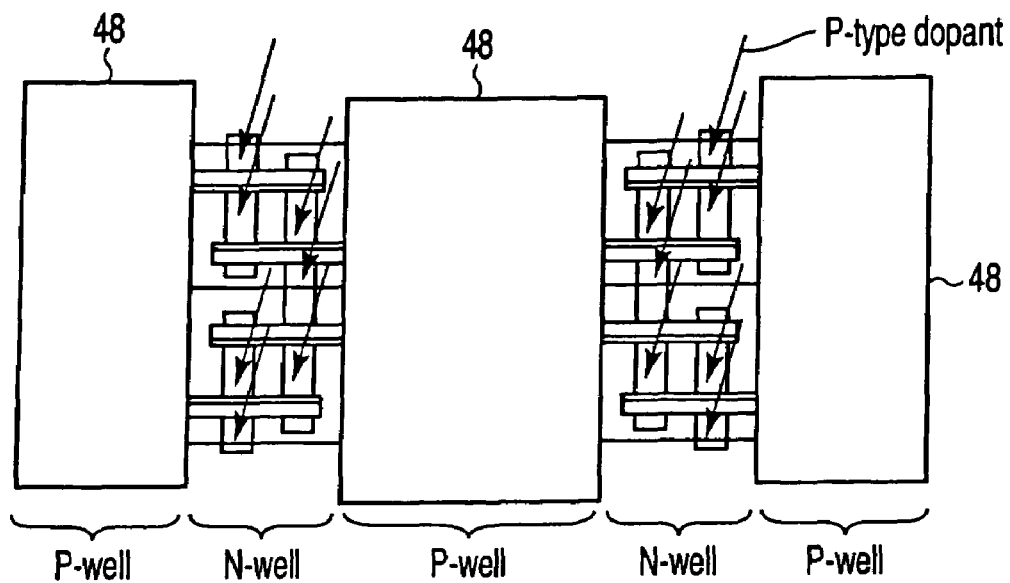
FIG. 46 is a sectional view schematically showing still another step of the semiconductor device manufacturing method according to the fifth embodiment of the present invention.

After the photoresist 47 is removed, a photoresist is applied to the entire surface, exposed, and developed to form a photoresist 48 which remains in only each P-well region, as shown in FIG. 46. A P-type dopant such as B (Boron) is doped into the entire surface by, e.g., ion implantation using the photoresist 48 as a mask, and thermally diffused to form a dopant diffusion region in the element region AA of each N-well region.

Figure 47:
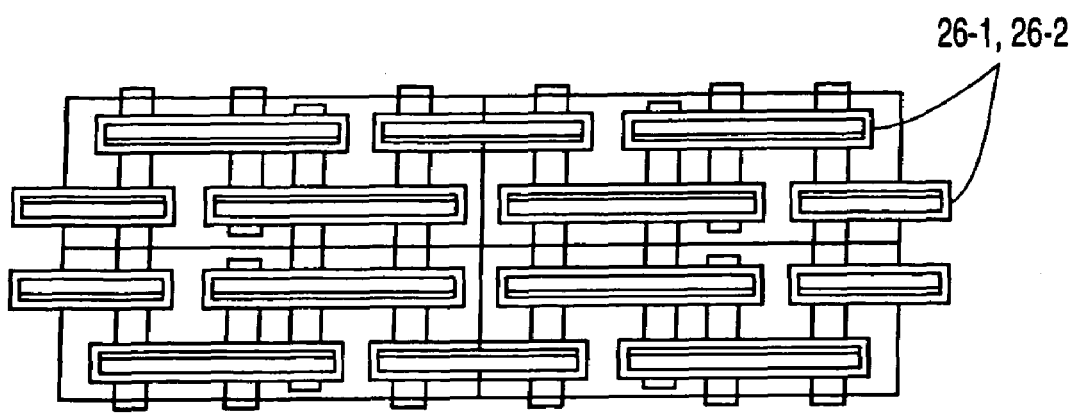
FIG. 47 is a sectional view schematically showing still another step of the semiconductor device manufacturing method according to the fifth embodiment of the present invention.

After the photoresist 48 is removed, side wall spacers 26-1 and 26-2 are formed by a known method, as shown in FIG. 47. In a step using a photoresist, as described above, P- and N-type dopants are respectively doped and diffused into N- and P-well regions by using the side wall spacers 26-1 and 26-2 as a mask. Through the above steps, the NMOS transistors N1 to N4 and PMOS transistors P1 and P2 having the sectional structures shown in FIGS. 36 and 37 can be formed. After that, a semiconductor device shown in FIG. 33 can be manufactured by a known step.

In the fifth embodiment, the NMOS transistors N1 to N4 and PMOS transistors P1 and P2 which are applied to an SRAM are not limited to transistors having the sectional structures shown in FIGS. 36 and 37. Semiconductor devices described in the first, third, and fourth embodiments and the modifications to them can also be applied.

As described above, a semiconductor device according to one aspect of the present invention comprises the gate insulating film 23 which is formed on the major surface of the semiconductor substrate 21, the gate electrode 24 which is formed on the gate insulating film, the first offset-spacer 25 which is formed in contact with one side surface of the gate electrode, the first spacer 26-2 which is formed in contact with the other side surface of the gate electrode, the second spacer 26-1 which is formed in contact with the first offset-spacer, the first source region 28-1 which is formed apart from the first drain region 27-1 in the major surface of the semiconductor substrate below the first spacer so as to sandwich the gate electrode and first offset-spacer between itself and the first drain region 27-1, the second source region 28-2 which is formed adjacent to the first source region, the first drain region 27-1 which is formed apart from the first source region 28-1 in the major surface of the semiconductor substrate below the second spacer so as to sandwich the gate electrode and first offset-spacer between itself and the first source region 28-1, and the second drain region 27-2 which is formed adjacent to the first drain region. The second source region 28-2 is formed at the position d3 deeper than the first source region 28-1, and the dopant concentration of the second source region 28-2 is higher than that of the first source region 28-1. The first source region 28-1 is formed at the position d1 deeper than the first drain region 27-1, and the dopant concentration of the first source region 28-1 is higher than that of the first drain region 27-1. The second drain region 27-2 is formed at the position d3 deeper than the first drain region 27-1, and the dopant concentration of the second drain region is higher than that of the first drain region.

A semiconductor device according to another aspect of the present invention comprises the gate insulating film 23 which is formed on the major surface of the semiconductor substrate 21, the gate electrode 24 which is formed on the gate insulating film, the first offset-spacer 25 which is formed in contact with one side surface of the gate electrode, the first spacer 26-2 which is formed in contact with the other side surface of the gate electrode, the second spacer 26-1 which is formed in contact with the first offset-spacer, and the source region 28 and drain regions 27-1 and 27-2 which are formed apart from each other in the major surface of the semiconductor substrate below the first and second spacers so as to sandwich the gate electrode and first offset-spacer. The source region is formed at the position d4 deeper than the drain region, and the dopant concentration of the source region is higher than that of the drain region.

The above structure can suppress the spread of the depletion layer because the first offset-spacer 25 separates the drain regions 27-1 and 27-2 and gate electrode to which a voltage is applied. Since the drain regions 27-1 and 27-2 are formed at the shallow position d5, concentration of the electric field can be prevented to suppress the spread of the depletion layer. The dopant concentration of the source region 28 is set higher than that of the drain region, which can reduce the resistance value and parasitic resistance. As a result, the short-channel effect can be relaxed to improve the reliability.

The present invention further includes the following desirable aspects.

(1) The semiconductor device further comprises the second offset-spacer 25-2 which is formed between the gate electrode 24 and the first spacer 26-2, and the film thickness of the first offset-spacer 25-1 is larger than or almost equal to that of the second offset-spacer 26-2.

(2) The gate insulating film 23 and first offset-spacer 25-1 are integrated.

(3) The semiconductor device further comprises the third offset-spacer 25-3 which is formed in contact with the side surfaces of the integrated gate insulating film and first offset-spacer 25.

A method of manufacturing a semiconductor memory device according to still another aspect of the present invention comprises a step of forming element isolation films 22 in the major surface of a semiconductor substrate 21 to form an element region, a step of forming a dummy pattern layer 30 on the semiconductor substrate in a prospective region of the element region where a drain region is to be formed, a step of forming an offset-spacer material 31 in the element region and on the dummy pattern layer, a step of etching back the offset-spacer material to form a first offset-spacer 25 in contact with the side wall of the dummy pattern layer, a step of forming a gate insulating film material in the element region and on the first offset-spacer and the dummy pattern layer, a step of forming a gate electrode material on the gate insulating film material, a step of anisotropically etching the entire surface to form a gate insulating film 23 and gate electrode 24 on the semiconductor substrate, a step of doping a dopant of a conductivity type opposite to that of the semiconductor substrate by using the dummy pattern layer 30 as a mask, thereby forming a first source region 28-1 in the semiconductor substrate, a step of removing the dummy pattern layer 30, a step of doping a dopant of the conductivity type opposite to that of the semiconductor substrate into the semiconductor substrate to form a first drain region 27-1 at a position d2 shallower than the first source region 28-1 in the semiconductor substrate, a step of forming a first spacer 26-2 on the side wall of the gate electrode and a second spacer 26-1 on the side wall of the first offset-spacer, and a step of doping a dopant of the conductivity type opposite to that of the semiconductor substrate into the semiconductor substrate to form a second source region 28-2 and second drain region 27-2 at a position d3 deeper than the first source region and first drain region in the semiconductor substrate.

According to this method, the dummy pattern layer 30 is formed on the semiconductor substrate in a prospective region where a drain region is to be formed. The first offset-spacer 25 is formed in contact with the side wall of the dummy pattern layer, and the gate electrode 24 is formed in contact with the side wall of the first offset-spacer. The first offset-spacer 25 is formed on only one side of the gate electrode, and the material, film thickness, and the like can be easily selected by selecting reaction conditions and the like. Thus, the material and film thickness of the first offset-spacer 25 enough to relax the short-channel effect can be easily selected to increase the reliability. The first source region 28-1 is formed using the dummy pattern layer 30 as a mask. In forming the source region 28-1, its dopant concentration, position, and the like can be easily selected independently of the drain region 27. This provides high selectivities of the first offset-spacer 25 and dopant diffusion region 28-1. Various optimal values can be selected to increase the reliability.

The present invention further includes the following desirable aspects.

(1) The method further comprises a step of doping a dopant of the conductivity type opposite to that of the semiconductor substrate by using the dummy pattern layer 30 as a mask, thereby forming a third source region 28-1 in the semiconductor substrate after the step of anisotropically etching the entire surface to form the gate insulating film 23 and gate electrode 24 on the semiconductor substrate, a step of removing the dummy pattern layer 30, a step of doping a dopant of the conductivity type opposite to that of the semiconductor substrate into the semiconductor substrate to form a third drain region 27-1 at a position shallower than the first source region 28-1 in the semiconductor substrate, a step of forming the first spacer 26-2 on the side wall of the gate electrode and the second spacer 26-1 on the side wall of the first offset-spacer, and a step of doping a dopant of the conductivity type opposite to that of the semiconductor substrate into the semiconductor substrate by using the first and second spacers as a mask, thereby forming a fourth drain region 27-2 at a position d5 shallower than the third source region 28-1 and deeper than the third drain region, and forming an LDD structure on only the drain side.

(2) The method further comprises a step of forming a second offset-spacer material having a film thickness smaller than or almost equal to that of the first offset-spacer in the element region and on the gate electrode and the dummy pattern layer after the step of anisotropically etching the entire surface to form the gate insulating film and gate electrode on the semiconductor substrate, and a step of anisotropically etching the entire surface to form a second offset-spacer 25-2 on the side wall of the gate electrode.

(3) The method further comprises a step of forming an insulating film material 36 in the element region and on the dummy pattern layer after the step of forming the dummy pattern layer on the semiconductor substrate in the prospective region of the element region where the drain region is to be formed, a step of forming the gate electrode material 37 on the insulating film material, and a step of anisotropically etching the entire surface to form a gate electrode and an insulating film 35 which is in contact with the side wall of the dummy pattern layer, acts as the gate insulating film and offset-spacer, and is an integration of the gate insulating film and offset-spacer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method of manufacturing a semiconductor device comprising:

forming an element isolation film in a major surface of a semiconductor substrate to form an element region;

forming a dummy pattern layer on the semiconductor substrate in a prospective drain region;

forming an offset-spacer material in the element region and on the dummy pattern layer;

etching back the offset-spacer material, thereby forming a first offset-spacer in contact with a side wall of the dummy pattern layer;

forming a gate insulating film and a gate electrode in contact with a side wall of the first offset-spacer;

doping a dopant by using the gate electrode and the dummy pattern layer as a mask, thereby forming a first source region in the semiconductor substrate;

removing the dummy pattern layer; and doping a dopant by using the gate electrode and the first offset-spacer as a mask, thereby forming a first drain region in the semiconductor substrate.

2. The method of manufacturing a semiconductor device according to claim 1, wherein the first drain region is formed in the semiconductor substrate such that the first drain region is at a position shallower than the first source region in the semiconductor substrate.

3. The method of manufacturing a semiconductor device according to claim 1, further comprising forming a first spacer on a side wall of the gate electrode and a second spacer on a side wall of the first offset-spacer after forming the first drain region.

4. The method of manufacturing a semiconductor device according to claim 3, further comprising doping a dopant by using the first and the second spacer as a mask, thereby forming the second source region and the second drain region in the semiconductor substrate, the second source region and the second drain region being at positions deeper than the first source region.

5. The method of manufacturing a semiconductor device according to claim 3, further comprising doping a dopant by using the first and the second spacer as a mask, thereby forming a fourth drain region at a position shallower than the first source region and deeper than the first drain region, and forming an LDD structure on only a drain side.

6. The method of manufacturing a semiconductor device according to claim 1, further comprising forming a second offset-spacer in the element region on the side wall of the gate electrode after forming the gate insulating film and the gate electrode.

* * * * *